United States Patent
Wang et al.

(10) Patent No.: US 12,106,728 B2
(45) Date of Patent: Oct. 1, 2024

(54) DISPLAY SUBSTRATE AND DISPLAY PANEL

(71) Applicant: BOE Technology Group Co., Ltd., Beijing (CN)

(72) Inventors: Lizhong Wang, Beijing (CN); Guangcai Yuan, Beijing (CN); Ce Ning, Beijing (CN); Hehe Hu, Beijing (CN); Nianqi Yao, Beijing (CN); Xin Xie, Beijing (CN); Yifang Huang, Beijing (CN); Liping Lei, Beijing (CN); Chen Xu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/908,359

(22) PCT Filed: Aug. 31, 2021

(86) PCT No.: PCT/CN2021/115683
§ 371 (c)(1),
(2) Date: Aug. 31, 2022

(87) PCT Pub. No.: WO2023/028839
PCT Pub. Date: Mar. 9, 2023

(65) Prior Publication Data
US 2024/0194161 A1   Jun. 13, 2024

(51) Int. Cl.
*G09G 3/36* (2006.01)
(52) U.S. Cl.
CPC ... *G09G 3/3677* (2013.01); *G09G 2300/0408* (2013.01); *G09G 2300/0426* (2013.01); *G09G 2310/0286* (2013.01)
(58) Field of Classification Search
CPC ......... G09G 3/3677; G09G 2300/0408; G09G 2300/0426; G09G 2310/0286
See application file for complete search history.

(56) References Cited

U.S. PATENT DOCUMENTS 6,538,631 B1 * 3/2003 Kwon .................. G09G 3/3614
345/98
6,577,293 B1 * 6/2003 Kwon .................. G09G 3/3614
345/96

(Continued)

FOREIGN PATENT DOCUMENTS

EP    1074966 A1 *  2/2001  ........... G09G 3/2011

OTHER PUBLICATIONS

Xue Yan et al., "31-Inch 4K Flexible Display Employing Gate Driver With Metal Oxide Thin-Film Transistors", IEEE Electron Device Letters, IEEE, USA vol. 42, No. 2, Dec. 21, 2020, pp. 188-191.

(Continued)

*Primary Examiner* — William Lu
(74) *Attorney, Agent, or Firm* — Banner & Witcoff, Ltd.

(57) ABSTRACT

A display substrate and a display panel are provided, the display substrate includes a first gate driver circuit and a second gate driver circuit that are respectively arranged on a first side and a second side of a display region; the first gate driver circuit includes a plurality of first shift register units arranged in a first direction, each first shift register unit includes a first thin film transistor; the second gate driver circuit includes a plurality of second shift register units arranged in the first direction, each second shift register unit includes a second thin film transistor having the same function as the first thin film transistor; an average turn-on current of at least one first thin film transistor is $I_{on1}$, and an average turn-on current of at least one second thin film transistor is $I_{on2}$, $I_{on1} > I_{on2}$.

20 Claims, 11 Drawing Sheets

(56) References Cited

U.S. PATENT DOCUMENTS

| | | | |
|---|---|---|---|
| 11,341,933 B2* | 5/2022 | Shin | G09G 3/035 |
| 11,727,889 B2* | 8/2023 | Kawachi | G09G 3/3291 |
| | | | 345/76 |
| 2002/0054009 A1* | 5/2002 | Koyama | G09G 3/3688 |
| | | | 257/E27.111 |
| 2005/0127998 A1* | 6/2005 | Maekawa | H03F 3/45237 |
| | | | 330/253 |
| 2011/0133789 A1* | 6/2011 | Nagumo | H03K 17/79 |
| | | | 327/108 |
| 2011/0142192 A1* | 6/2011 | Lin | G11C 19/28 |
| | | | 377/77 |
| 2011/0215328 A1 | 9/2011 | Morosawa et al. | |
| 2012/0098815 A1* | 4/2012 | Hou | G09G 3/3677 |
| | | | 345/212 |
| 2013/0001561 A1* | 1/2013 | Fujimoto | H01L 29/42384 |
| | | | 257/66 |
| 2013/0002310 A1* | 1/2013 | Liu | G09G 3/3677 |
| | | | 327/109 |
| 2015/0333620 A1* | 11/2015 | Xi | H02M 3/07 |
| | | | 345/215 |
| 2016/0042807 A1 | 2/2016 | Miyake et al. | |
| 2016/0104425 A1* | 4/2016 | Kim | G09G 3/3266 |
| | | | 345/80 |
| 2017/0018220 A1* | 1/2017 | Takahara | G09G 3/30 |
| 2017/0052635 A1* | 2/2017 | Yu | G06F 3/0446 |
| 2017/0092375 A1* | 3/2017 | Xia | G09G 3/3677 |
| 2017/0270879 A1* | 9/2017 | Han | G11C 19/28 |
| 2018/0190231 A1 | 7/2018 | Shi et al. | |
| 2020/0098296 A1* | 3/2020 | Qiu | G09G 3/2092 |
| 2020/0175928 A1* | 6/2020 | Baek | G09G 3/3291 |
| 2020/0259415 A1* | 8/2020 | Chiu | H02M 3/1584 |
| 2021/0158737 A1* | 5/2021 | He | G09G 3/20 |
| 2022/0059045 A1* | 2/2022 | Kobayashi | G06F 1/1652 |
| 2022/0188257 A1* | 6/2022 | Heckroth | G06F 13/4282 |
| 2023/0154430 A1* | 5/2023 | Tsai | G09G 3/3677 |
| | | | 345/87 |
| 2023/0395027 A1* | 12/2023 | Lu | H10K 59/1216 |

OTHER PUBLICATIONS

Jun. 7, 2024—(EP) Extended European Search Report—App 21955406.0, pp. 1-8.

* cited by examiner

DISPLAY SUBSTRATE AND DISPLAY PANEL

The application is a U.S. National Phase Entry of International Application No. PCT/CN2021/115683 filed on Aug. 31, 2021, designating the United States of America. The present application claims priority to and the benefit of the above-identified application and the above-identified application is incorporated by reference herein in its entirety.

TECHNICAL FIELD

Embodiments of the present disclosure relate to a display substrate and a display panel.

BACKGROUND

With the gradual development of display technology and manufacturing technology, large-size display devices are gradually applied in various aspects of life to meet people's increasing visual needs. For example, for the display panel having a size of 50-inch or more, or even 100-inch or more, the display uniformity of the display panel is an important indicator to evaluate the display effect of the display panel. In the production process of the display panel, the display uniformity affects key indicators such as product performance and yield.

SUMMARY

At least one embodiment of the present disclosure provides a display substrate, the display substrate comprises a base substrate, and a first gate driver circuit and a second gate driver circuit that are on the base substrate, the display substrate comprises a display region, and the first gate driver circuit and the second gate driver circuit are respectively on a first side of the display region and a second side of the display region that are opposite to each other; the first gate driver circuit comprises a plurality of first shift register units arranged in a first direction, each of the plurality of first shift register units comprises a first thin film transistor having a first function in the first gate driver circuit, the first thin film transistor comprises a first active layer, and the first active layer comprises a metal oxide semiconductor material; the second gate driver circuit comprises a plurality of second shift register units arranged in the first direction, each of the plurality of second shift register units comprises a second thin film transistor having a same function as the first thin film transistor, and the second thin film transistor comprises a second active layer, and the second active layer comprises a metal oxide semiconductor material; an average turn-on current of the first thin film transistor of at least one first shift register unit of the plurality of first shift register units is $I_{on1}$, and an average turn-on current of the second thin film transistor of at least one second shift register unit of the plurality of second shift register units is $I_{on2}$, and $I_{on1}>I_{on2}$.

For example, in the display substrate provided by at least one embodiment of the present disclosure, the first thin film transistor and the second thin film transistor are output transistors playing a function of outputting signals, or input transistors playing a function of inputting signals, or reset transistors.

For example, in the display substrate provided by at least one embodiment of the present disclosure, the display region comprises a plurality of sub-pixels and scanning lines connected with the plurality of sub-pixels, and the first thin film transistor and the second thin film transistor are the output transistors playing the function of outputting signals, and are configured to provide gate scanning signals to the scanning lines connected with the plurality of sub-pixels.

For example, in the display substrate provided by at least one embodiment of the present disclosure, the scanning lines extend along a second direction, and the second direction is substantially perpendicular to the first direction; the first side and the second side are opposite to each other in the second direction.

For example, in the display substrate provided by at least one embodiment of the present disclosure, $I_{on1}-I_{on2}<I_{on2}\times 20\%$.

For example, in the display substrate provided by at least one embodiment of the present disclosure, $I_{on1}-I_{on2}<I_{on2}\times 10\%$.

For example, in the display substrate provided by at least one embodiment of the present disclosure, the second side has a first region, a second region and a third region that are sequentially arranged along the first direction, an average turn-on current of a plurality of second thin film transistors in the first region is $I_{on21}$, an average turn-on current of a plurality of second thin film transistors in the second region is $I_{on22}$, and an average turn-on current of a plurality of the second thin film transistors in the third region is $I_{on23}$, $I_{on21}>I_{on22}$, and $I_{on23}>I_{on22}$.

For example, in the display substrate provided by at least one embodiment of the present disclosure, in a case where gate voltages Vg of a plurality of first thin film transistors are in a range of 10V-20V, turn-on currents of the plurality of first thin film transistors and a plurality of second thin film transistors are all greater than 1200 µA.

For example, in the display substrate provided by at least one embodiment of the present disclosure, in a case where gate voltages Vg of a plurality of first thin film transistors are in a range of 10V-20V, a maximum value of turn-on currents of the plurality of first thin film transistors is $I_{on1MAX}$, a minimum value of the turn-on currents of the plurality of first thin film transistors is $I_{on1MIN}$, and $I_{on1MAX}-I_{on1MIN}\leq 1000$ µA; in a case where gate voltages Vg of a plurality of second thin film transistors are in a range of 10V-20V, a maximum value of turn-on currents of the plurality of second thin film transistors is $I_{on2MAX}$, and a minimum value of the turn-on currents of the plurality of second thin film transistors is $I_{on2MIN}$, and $I_{on2MAX}-I_{on2MIN}\leq 1000$ µA.

For example, in the display substrate provided by at least one embodiment of the present disclosure, turn-on currents of a plurality of first thin film transistors of the plurality of first shift register units and a plurality of second thin film transistors of the plurality of second shift register units have a maximum value of $I_{onMAX}$ and a minimum value of $I_{onMIN}$, it is defined that $3\delta_1=(I_{onMAX}-I_{onMIN})/(I_{onMAX}+I_{onMIN})$, then $3\delta_1=50\sim 700$.

For example, in the display substrate provided by at least one embodiment of the present disclosure, both the first thin film transistor and the second thin film transistor are reset transistors, and gate electrodes of the reset transistors are respectively connected to a reset control signal terminal.

For example, in the display substrate provided by at least one embodiment of the present disclosure, $I_{on1}-I_{on2}<I_{on2}\times 30\%$.

For example, in the display substrate provided by at least one embodiment of the present disclosure, $I_{on1}-I_{on2}<I_{on2}\times 20\%$.

For example, in the display substrate provided by at least one embodiment of the present disclosure, turn-on currents of a plurality of first thin film transistors of the plurality of first shift register units and a plurality of second thin film transistors of the plurality of second shift register units have a maximum value of $I_{onMAX}$, and a minimum value of $I_{onMIN}$, it is defined that $3\delta_1=(I_{onMAX}-I_{onMIN})/(I_{onMAX}+I_{onMIN})$, then $3\delta_1=50\sim700$.

For example, in the display substrate provided by at least one embodiment of the present disclosure, an average threshold voltage of a plurality of first thin film transistors of the plurality of first shift register units is $V_{th1}$, and an average threshold voltage of a plurality of second thin film transistors of the plurality of second shift register units is $V_{th2}$, then $V_{th1}>V_{th2}$.

For example, in the display substrate provided by at least one embodiment of the present disclosure, $V_{th1}-V_{th2}<|V_{th2}|\times 30\%$.

For example, in the display substrate provided by at least one embodiment of the present disclosure, in a case where a source-drain input voltage of each of the plurality of first thin film transistors is Vd, Vd=10V-20V and a turn-on current of each of the plurality of first thin film transistors is Id, Id=$10^{-8}$ A, $|V_{th1}|<2V$, $|V_{th2}|<2V$.

For example, in the display substrate provided by at least one embodiment of the present disclosure, a maximum value of threshold voltages of the plurality of first thin film transistors is $V_{th1MAX}$, a minimum value of the threshold voltages of the plurality of first thin film transistors is $V_{th1MIN}$, and $V_{th1MAX}-V_{th1MIN}\leq 2V$; a maximum value of threshold voltages of the plurality of second thin film transistors is $V_{th2MAX}$, a minimum value of the threshold voltages of the plurality of second thin film transistors is $V_{th2MIN}$, and $V_{th2MAX}-V_{th2MIN}\leq 2V$.

For example, in the display substrate provided by at least one embodiment of the present disclosure, threshold voltages of the plurality of first thin film transistors of the plurality of first shift register units and the plurality of second thin film transistors of the plurality of second shift register units have a maximum value of $V_{thMAX}$ and a minimum value of $V_{thMIN}$, it is defined that $3\delta_2=(V_{thMAX}-V_{thMIN})/(V_{thMAX}+V_{thMIN})$, then $3\delta_2=0.1\sim 2.5$.

For example, in the display substrate provided by at least one embodiment of the present disclosure, an average lifetime of a plurality of first thin film transistors of the plurality of first shift register units is longer than an average lifetime of a plurality of second thin film transistors of the plurality of second shift register units.

For example, in the display substrate provided by at least one embodiment of the present disclosure, viewed from the base substrate to the first gate driver circuit, the first side is a left side of the display region and the second side is a right side of the display region.

For example, in the display substrate provided by at least one embodiment of the present disclosure, the first active layer and the second active layer are in a same layer.

For example, in the display substrate provided by at least one embodiment of the present disclosure, each of the plurality of sub-pixels comprises a pixel driving circuit, and the pixel driving circuit comprises a third thin film transistor, the third thin film transistor comprises a third active layer, the third active layer is in a same layer as the first active layer and the second active layer, and comprises a plurality of metal oxide semiconductor layers that are stacked, and a material of a metal oxide semiconductor layer close to a gate electrode of the third thin film transistor is amorphous IGZO, in the amorphous IGZO, In:Ga:Zn is 1:1:1 or 4:2:3; a material of a metal oxide semiconductor layer away from the gate electrode of the third thin film transistor is crystalline IGZO, and in the crystalline IGZO, In:Ga:Zn is 4:2:3 or 1:3:6.

For example, in the display substrate provided by at least one embodiment of the present disclosure, a size of the display substrate along the second direction is larger than a size of the display substrate along the first direction.

At least one embodiment of the present disclosure further provides a display panel, the display panel comprises a display substrate and an opposite substrate that are opposite to each other, and a liquid crystal layer between the display substrate and the opposite substrate, the display substrate is the display substrate provided by the embodiments of the present disclosure.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the disclosure and thus are not limitative of the present disclosure.

DETAILED DESCRIPTION

Figure 1:
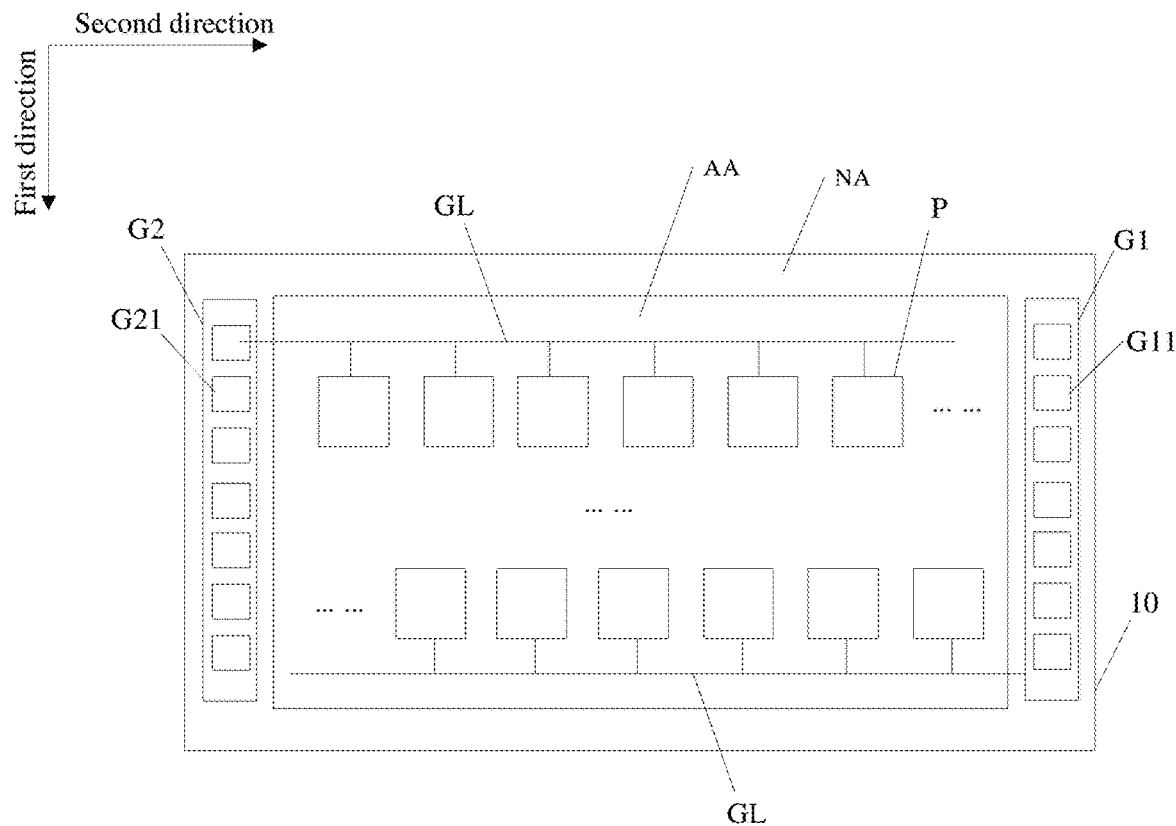
FIG. 1 is a schematic planar view of a display substrate provided by at least one embodiment of the present disclosure.

In order to make objects, technical solutions and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment (s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. Also, the terms "comprise," "comprising." "comprise," "comprising." etc., are intended to specify that the elements or the objects stated before these terms encompass the elements or the objects and equivalents thereof listed after these terms, but do not preclude the other elements or objects. The phrases "connect". "connected", etc., are not intended to define a physical connection or mechanical connection, but may comprise an electrical connection, directly or indirectly. "On," "under," "left." "right" and the like are only used to indicate relative position relationship, and when the position of the object which is described is changed, the relative position relationship may be changed accordingly.

As mentioned above, for a large-size display panel, the display uniformity of the display panel is an important indicator to evaluate the display effect of the display panel. In the production process of the display panel, it is the direction that the technicians in the art are working hard to form a display device with better display uniformity.

At least one embodiment of the present disclosure provides a display substrate and a display panel, the display substrate comprises a base substrate, and a first gate driver circuit and a second gate driver circuit that are on the base substrate; the display substrate comprises a display region, and the first gate driver circuit and the second gate driver circuit are respectively on a first side of the display region and a second side of the display region that are opposite to each other; the first gate driver circuit comprises a plurality of first shift register units arranged in a first direction, each of the plurality of first shift register units comprises a first thin film transistor having a first function in the first gate driver circuit, the first thin film transistor comprises a first active layer, and the first active layer comprises a metal oxide semiconductor material; the second gate driver circuit comprises a plurality of second shift register units arranged in the first direction, each of the plurality of second shift register units comprises a second thin film transistor having the same function as the first thin film transistor, and the second thin film transistor comprises a second active layer, and the second active layer comprises a metal oxide semiconductor material; an average turn-on current of the first thin film transistor of at least one first shift register unit of the plurality of first shift register units is $I_{on1}$, and an average turn-on current of the second thin film transistor of at least one second shift register unit of the plurality of second shift register units is $I_{on2}$, and $I_{on1} > I_{on2}$.

The display substrate provided by embodiments of the present disclosure can be used to form LCD (Liquid Crystal Display) products with a larger size (for example, 50-100 inches or more), which adopts the above-mentioned double-sided GOA (Gate on Array) circuit to drive the display process. Metal oxide TFT (Oxide thin film transistor, hereinafter referred to as Oxide-TFT) is used in the double-sided GOA circuit.

The GOA circuit adopting the Oxide-TFT has a higher turn-on current Ion and a lower turn-off current Ioff, and the carrier mobility is 10-100 times that of a thin film transistor adopting a-Si, and therefore the GOA circuit has strong driving ability, and is suitable for large-size, high-resolution and high-frequency driven products.

At present, the display panel using this type of GOA circuit has a problem of poor display. The main reason is that the threshold voltage Vth drift of the internal TFT (for example, the TFT which mainly plays the reset function) of the GOA circuit leads to the failure of the cascade connection, and the GOA circuit cannot work normally.

Under the condition that the process uniformity needs to be improved, the Vth drift of the TFT which mainly plays the reset function is too large, which is easy to cause the GOA circuit failure, resulting in poor display. Improving the uniformity in the manufacturing process of the display panel and improving the Vth drift of the internal TFT of the GOA circuit are the main directions to overcome at present.

Specifically, TFTs with the same function are located in different regions, and the Vth drift severities of the TFTs are different. For example, the Vth drift degrees of the TFTs in the dual-drive GOA located on both the left side and right side of the display panel are different. In addition, the Vth drift degrees of TFTs with different functions in the GOA circuit located on the same side of the display panel are also different.

Figure 10:
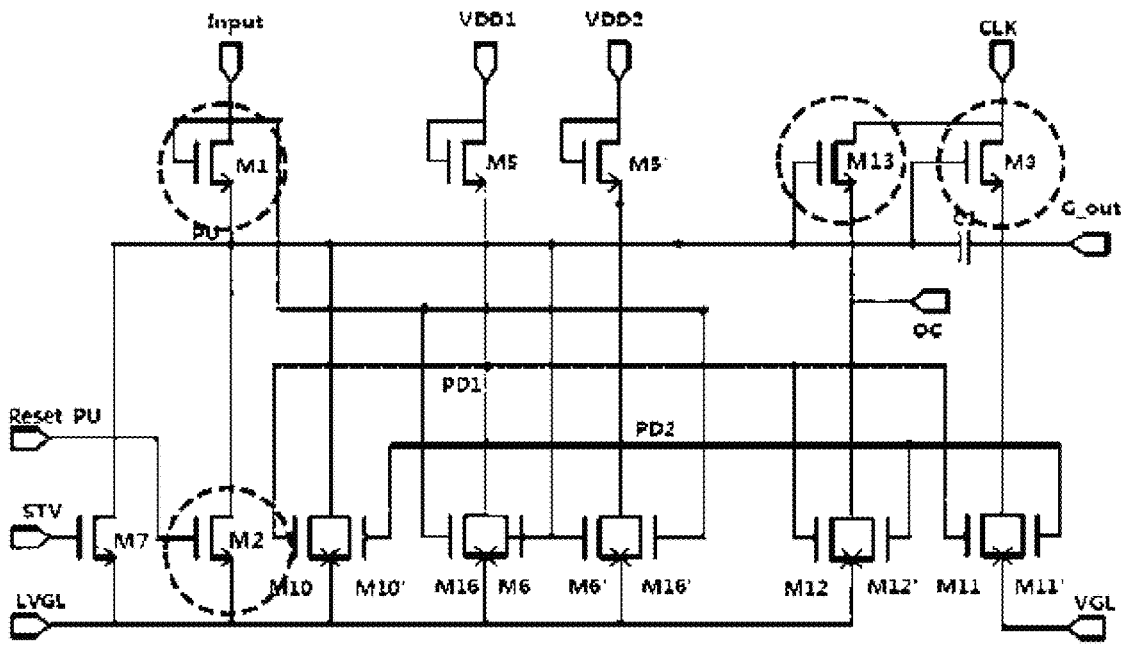
FIG. 10 is a circuit diagram of a GOA architecture provided by at least one embodiment of the present disclosure.

For example, for the GOA architecture of the 17T1C circuit shown in FIGS. 10, M1, M2 and M13 are the main reset units, and M3 is the output transistor, which is helpful for PU bootstrapping. These four transistors are the main transistors. Among them, M1 is connected to a signal input terminal and is called an input transistor, and M13 is related to the output signal and can also be called an output transistor. The Vth drift of these four transistors leads to the failure of the cascade relationship, and the GOA circuit cannot work normally. Of course, the drift degrees of M10 and M11 are also large.

For the Oxide-TFT in the GOA circuit provided by the embodiments of the present disclosure, in some embodiments, the TFT is a bottom gate structure of back channel etching, the active layer is a single-layer metal oxide semiconductor layer structure or stacked metal oxide semiconductor layers structure, the material of the single-layer metal oxide semiconductor layer structure or the stacked metal oxide semiconductor layers structure is IGZO, and the number ratio of metal atoms in any metal oxide semiconductor layer is 1:1:1, or 4:2:3, or 1:3:6, or other ratios, the IGZO can be mixed with components such as N. F and the like to improve the device performance.

For GOA circuits with other architectures, there may be similar situations as described above, which is not repeated here.

The uniformity of the display substrate provided by the embodiments of the present disclosure is relatively high, and the display defect can be overcome.

The above-mentioned double-sided driving GOA provided by the embodiments of the present disclosure is respectively referred to as the first gate driver circuit and the second gate driver circuit in the description, which are both Oxide-TFT driving circuits.

The display substrate and display panel provided by the embodiments of the present disclosure are explained by the following specific embodiments.

At least one embodiment of the present disclosure provides a display substrate. FIG. 1 shows a planar view of the display substrate at a top view angle. As shown in FIG. 1, the display substrate includes a base substrate 10 and a first gate driver circuit G1 and a second gate driver circuit G2 that are arranged on the base substrate 10. The display substrate includes a display region AA, the display region AA includes a plurality of sub-pixels P arranged in an array. The first gate driver circuit G1 and the second gate driver circuit G2 are respectively arranged on the first side and the second side of the display region AA which are opposite to each other. The gate driver circuits being on the left and right sides of the display region AA is illustrated in FIG. 1.

For example, as shown in FIG. 1, the display substrate further includes a peripheral region NA surrounding the display region AA. In this case, the first gate driver circuit G1 and the second gate driver circuit G2 are respectively arranged on the first side and the second side of the display region AA, which may be the case that the first gate driving circuit G1 and the second gate driving circuit G2 are respectively arranged in the peripheral region NA at the first side and the second side of the display region AA that are opposite to each other, as shown in FIG. 1. Or, in other examples, at least a part of the first gate driver circuit G1 and the second gate driver circuit G2 may be disposed in the display region AA, and disposed on the first side and the second side that are opposite to each other in the display region AA. The embodiments of the present disclosure do not limit the specific positions of the first gate driver circuit G1 and the second gate driver circuit G2.

Figure 2A:
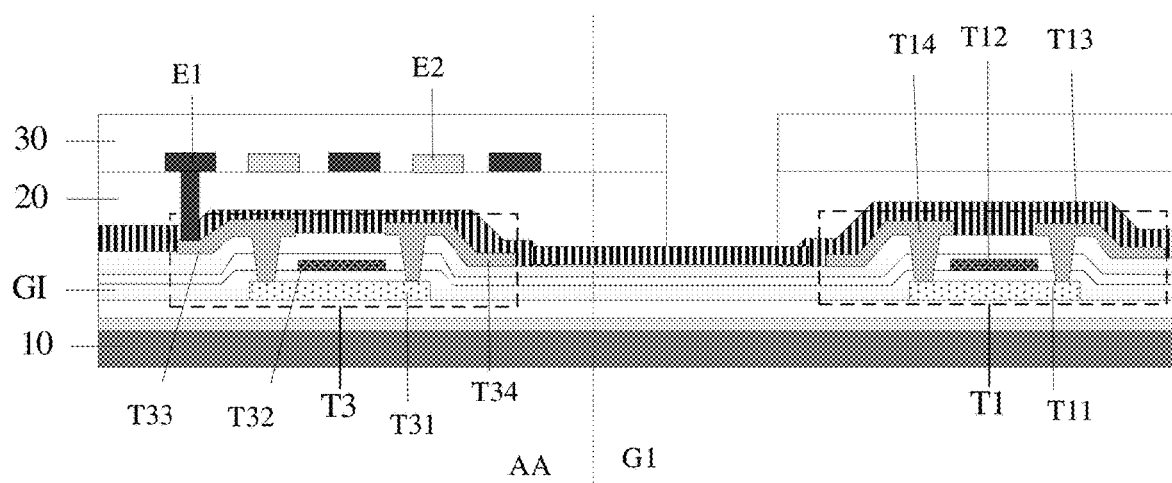
FIG. 2A is a partial cross-sectional schematic diagram of a first thin film transistor and a pixel driving circuit of a sub-pixel closest to the first thin film transistor in a display substrate provided by at least one embodiment of the present disclosure.

For example, as shown in FIG. 1, the first gate driver circuit G1 includes a plurality of first shift register units G11 arranged in a first direction (shown as the column direction of pixels in FIG. 1), and each of the plurality of first shift register units G11 includes a first thin film transistor T1. For example, FIG. 2A shows a schematic cross-sectional view of the first thin film transistor T1 and a partial schematic cross-sectional view of a pixel driving circuit of the sub-pixel P closest to the first thin film transistor T1 (in LCD products, the pixel driving circuit can be understood as a circuit such as a switch transistor). As shown in FIG. 2A, the first thin film transistor T1 includes a first active layer T11, and the first active layer T11 includes a metal oxide semiconductor material, such as at least one metal element selected from a group consisting of In, Zn, Ga, Sn, Pr, and so on. For example, in some embodiments, the metal oxide semiconductor material may be a ZnO-based material doped with rare earth elements, IIIB-group elements, Sn, In, N. F or other elements, or an $In_2O_3$-based material doped with rare earth elements, IIIB-group elements, Sn, In, N, F or other elements. A typical target or active layer component include IGZO, ITZO, IGZTO, Ln-IZO, etc., and the proportions of metals in these materials are also different, which is not described here. Among them, Ln-IZO is a material in which lanthanide metal is doped into IZO, and lanthanide metal is a part of rare earth metal, which is an IB-group element.

For example, the pixel driving circuit of the sub-pixel P located in the display region AA includes a third thin film transistor T3, and the third thin film transistor T3 includes a third active layer T31. For example, in some examples, the third active layer T31 is arranged in the same layer as the first active layer T11.

It should be noted that, in the embodiments of the present disclosure, the term "in the same layer" means that two functional layers or structural layers are in the same layer and formed of the same material in the hierarchical structure of the display substrate, that is, in the manufacturing process of the display substrate, the two functional layers or structural layers can be formed by the same material layer, and the required patterns and structures can be formed by the same patterning process. Therefore, the manufacturing process of the display substrate can be simplified.

That is, in the embodiments of the present disclosure, the Oxide-TFT thin film transistors in the regions where the display region AA and the GOA circuit are located are formed by one process, and the materials of the active layers in these two regions are the same.

Figure 3:
FIG. 3 is a schematic cross-sectional view of active layers of a first thin film transistor, a second thin film transistor and a third thin film transistor in a display substrate provided by at least one embodiment of the present disclosure.

For example, in some embodiments, the first active layer T11, the second active layer T21, and the third active layer T31 all include a plurality of metal oxide semiconductor layers that are stacked. For example, FIG. 3 shows a schematic cross-sectional view of a plurality of metal oxide semiconductor layers that are stacked. In some embodiments, as shown in FIG. 3, the metal oxide semiconductor layer μl close to the gate electrode of the third thin film transistor T3 may adopt amorphous IGZO, and in the amorphous IGZO, In:Ga:Zn is 1:1:1 or 4:2:3; the metal oxide semiconductor layer A3 away from the gate electrode of the third thin film transistor T3 may adopt crystalline IGZO, and in the crystalline IGZO, In:Ga:Zn is 4:2:3 or 1:3:6.

It should be noted that FIG. 3 shows two stacked metal oxide semiconductor layers as an example, and in other examples, the number of the metal oxide semiconductor layers may be three or four, or more.

For example, as shown in FIG. 1, the second gate driver circuit G2 includes a plurality of second shift register units G21 arranged in a first direction (such as the column direction of pixels), and each of the second shift register units G21 includes a second thin film transistor T2 having the same function as the first thin film transistor T1. For example, the first shift register unit G11 and the second shift register unit G21 have basically the same circuit structure. In the first shift register unit G11 and the second shift register unit G21, the first thin film transistor T1 and the second thin film transistor T2 are basically at the same position, have basically the same circuit connection relationship and are used to realize the same function.

Figure 2B:
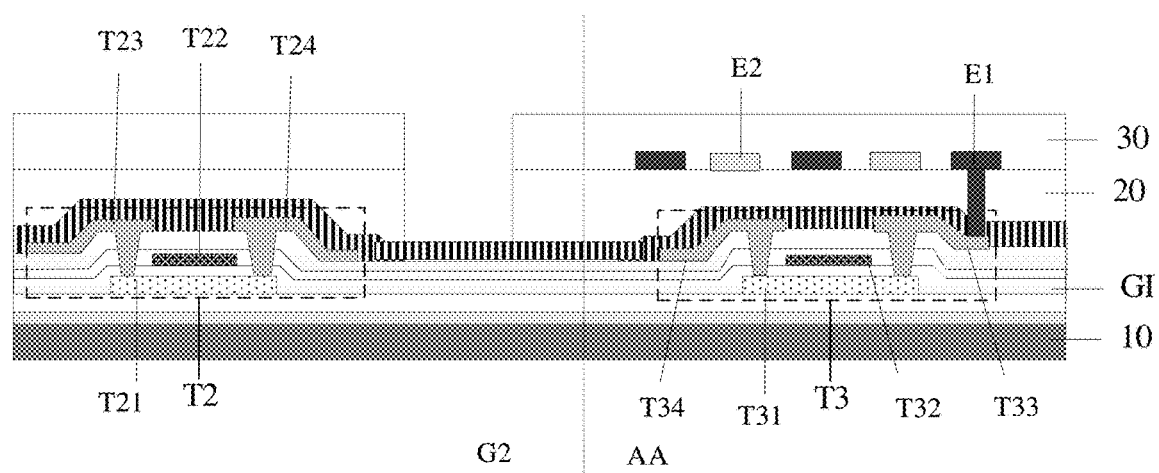
FIG. 2B is a partial cross-sectional schematic diagram of a second thin film transistor and a pixel driving circuit of a sub-pixel closest to the second thin film transistor in a display substrate provided by at least one embodiment of the present disclosure.

For example, FIG. 2B shows a schematic cross-sectional view of the second thin film transistor T2 and a partial schematic cross-sectional view of a pixel driving circuit of the sub-pixel P closest to the second thin film transistor T2. As shown in FIG. 2B, the second thin film transistor T2 includes a second active layer T21, and the second active layer T21 includes a metal oxide semiconductor material. For example, the first active layer T11 and the second active layer T21 are arranged in the same layer, for example, the first active layer T11, the second active layer T21 and the third active layer T31 are all arranged in the same layer, so that the manufacturing process of the display substrate can be simplified.

In the field of LCD, the bottom gate back channel etching structure (referred to as bottom gate BCE structure for short) with simpler process procedure is widely used. The above-mentioned FIGS. 2A and 2B are only used to illustrate the relationship between the active layers of the Oxide-TFTs and the TFTs in the region where the GOA circuit is located and the display region AA, and are not used to limit the case that the TFTs only use the top gate structure in the LCD technical field. For example, the average turn-on current of the plurality of first thin film transistors T1 of the plurality of first shift register units G11 is $I_{on1}$, the average turn-on current of the plurality of second thin film transistors of the plurality of second shift register units G21 is $I_{on2}$, and $I_{on1} > I_{on2}$.

It should be noted that in the embodiments of the present disclosure, the turn-on current of a thin film transistor refers to $I_{DS}$.

For example, $Ion = I_{DS} = W/L * A/(d\varepsilon(Vgs-Vth-Vds/2))Vds$, in which d represents the thickness of the gate insulation layer (i.e., the insulation layer GI between the gate electrode and the active layer), $\varepsilon$ represents the dielectric constant of the gate insulation layer, $I_{DS}$ represents the current between the source electrode and the drain electrode, W/L represents the width-to-length ratio of the channel of the thin film transistor, and A represents a fixed constant, $A=\mu\varepsilon_0$, that is, A equals to the carrier mobility of the channel multiplied by $\varepsilon_0$, Vgs represents the voltage between the gate electrode and the source electrode, Vth represents the threshold voltage, and Vds represents the voltage between the source electrode and the drain electrode.

For example, in some embodiments, the first thin film transistor T1 and the second thin film transistor T2 are output transistors playing a function of outputting signals, or input transistors playing a function of inputting signals, or reset transistors, which will be described in detail later.

For example, in some embodiments, as shown in FIG. 1, the display region AA further includes scanning lines GL connected to a plurality of sub-pixels P. For example, the first thin film transistor T1 and the second thin film transistor T2 are output transistors configured to be directly or indirectly electrically connected to the scanning lines GL to provide gate scanning signals to the plurality of sub-pixels P.

For example, in some embodiments, as shown in FIG. 1, the scanning lines GL extend in a second direction (the horizontal direction shown in FIG. 1), the second direction is substantially perpendicular to the first direction, and the first side and the second side are opposite to each other in the second direction.

For example, in some embodiments, $I_{on1} - I_{on2} < I_{on2} \times 20\%$, that is, the average turn-on current of the plurality of first thin film transistors on the first side does not exceed 20% of the average turn-on current of the second thin film transistors on the second side compared with the average turn-on current of the plurality of second thin film transistors on the second side. Such current uniformity can solve the problem of abnormal display caused by the characteristic difference of the TFTs.

For example, in some embodiments, $I_{on1} - I_{on2} < I_{on2} \times 10\%$. Such current uniformity can solve the problem of abnormal display caused by the characteristic difference of the TFTs.

Figure 4:
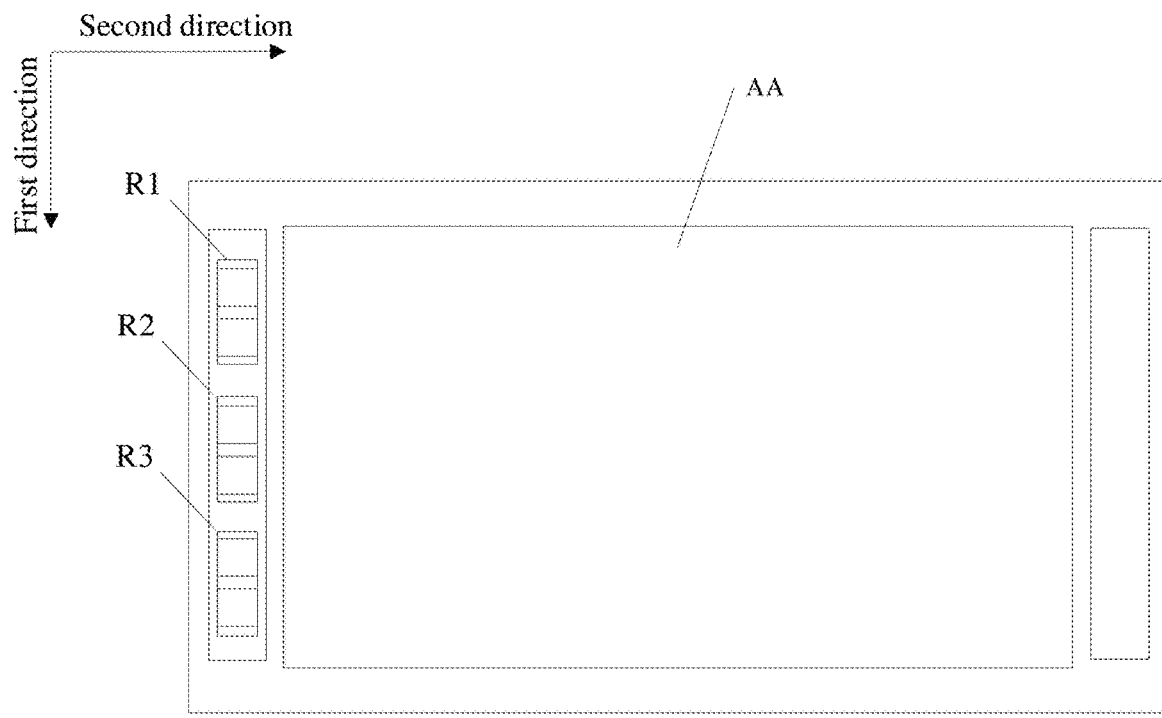
FIG. 4 is another schematic planar view of a display substrate provided by at least one embodiment of the present disclosure.
Figure 5A:
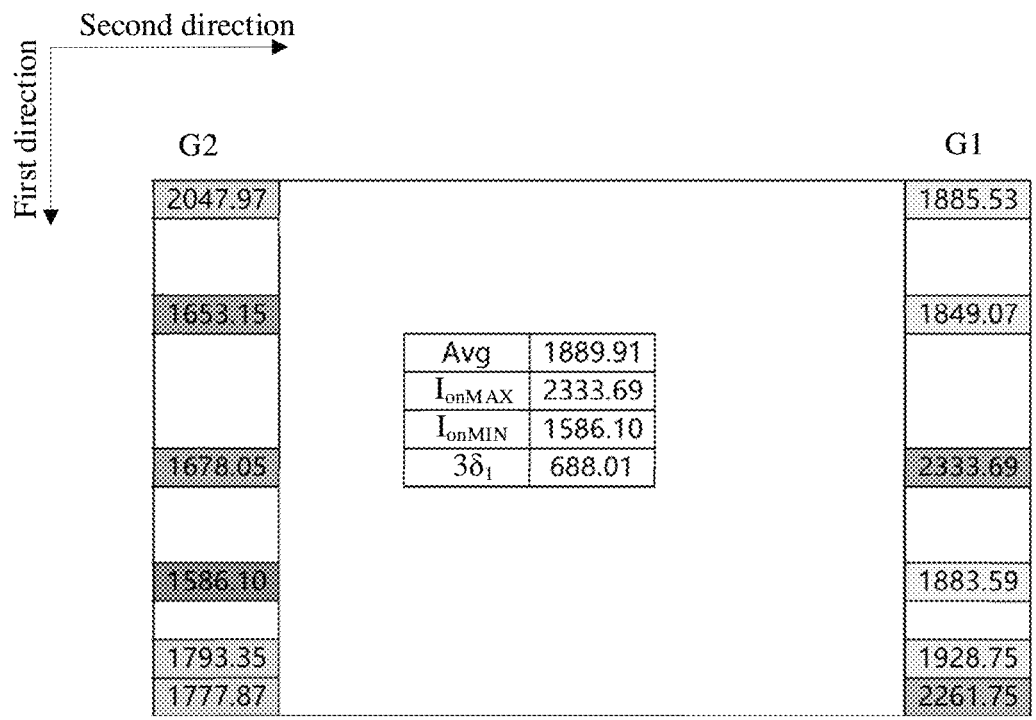
FIGS. 5A-5D are a plurality of sets of data of turn-on currents of a plurality of first thin film transistors and a plurality of second thin film transistors that serve as output transistors in a display substrate provided by at least one embodiment of the present disclosure.
Figure 5B:
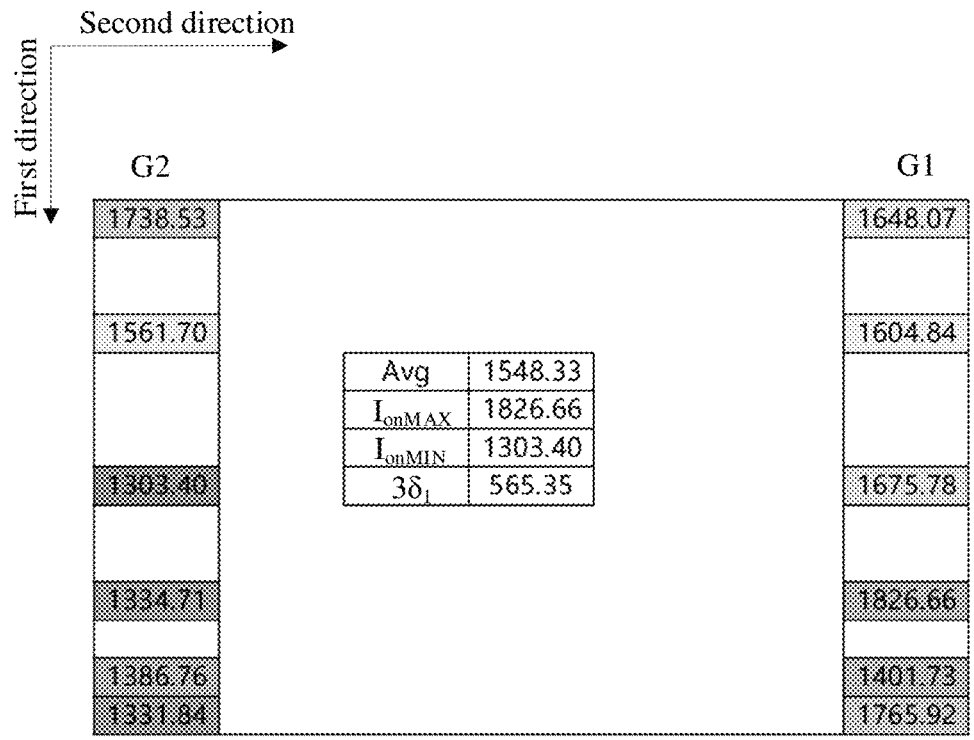
Figure 5C:
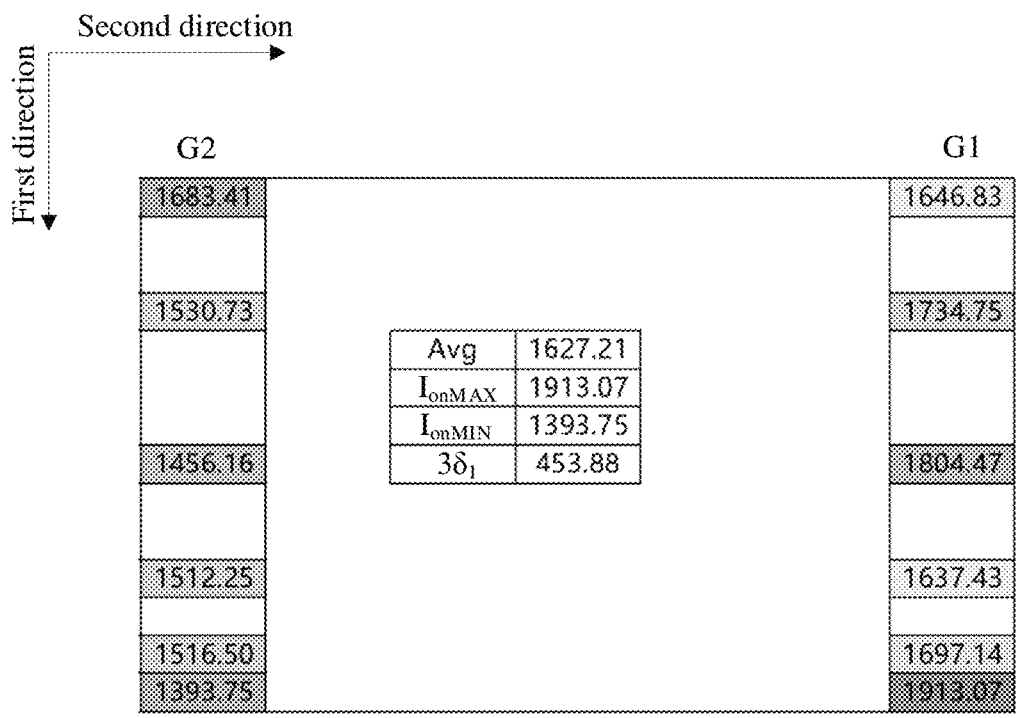
Figure 5D:
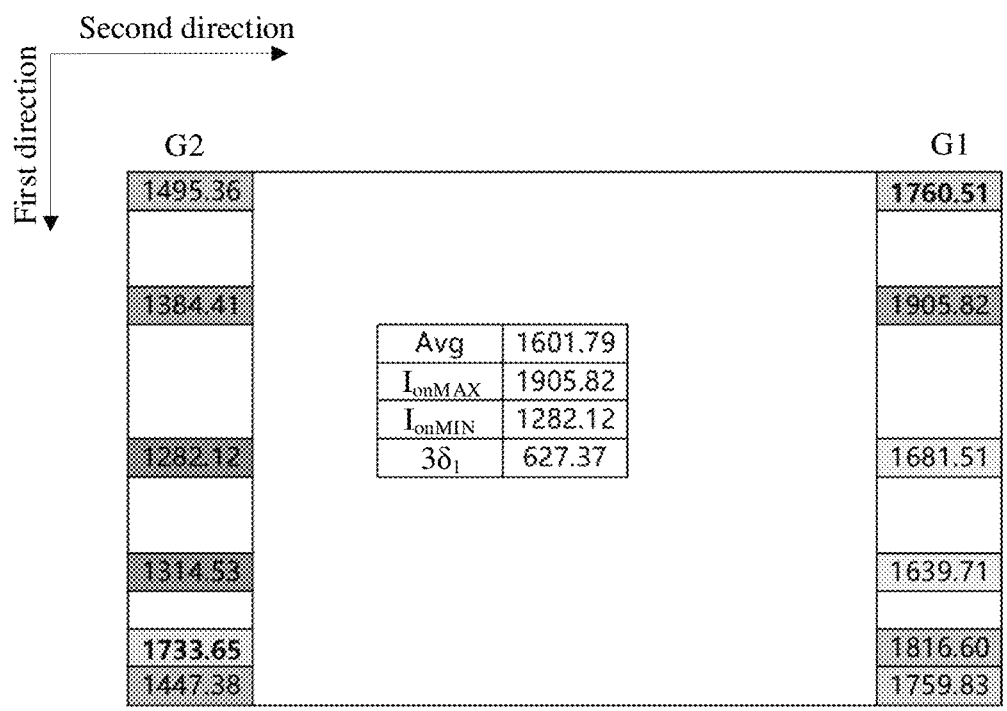
Figure 6A:
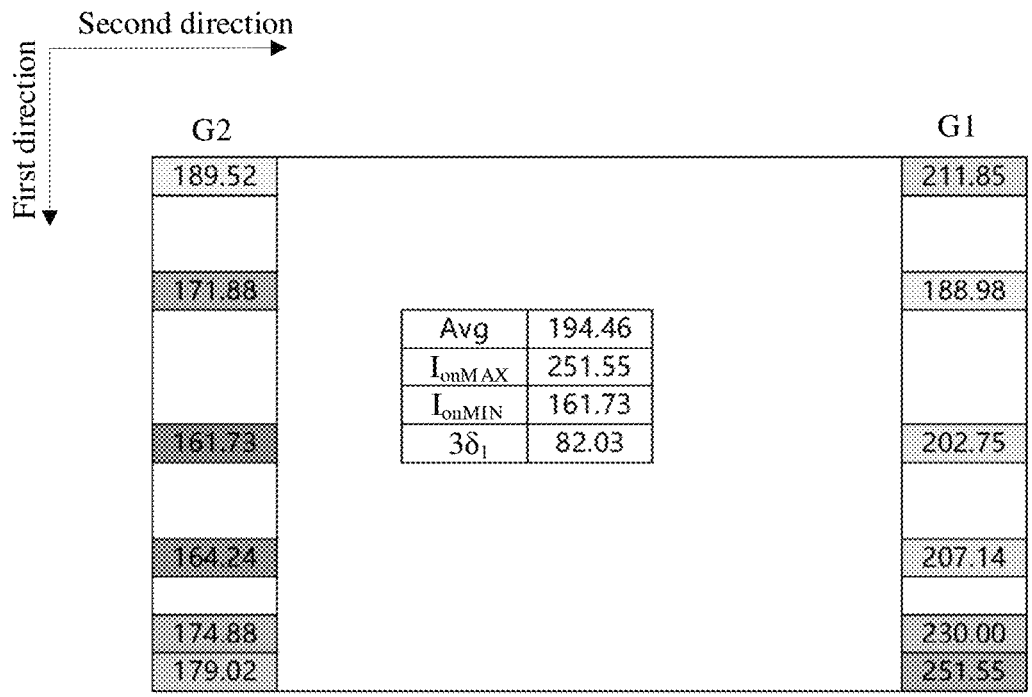
FIGS. 6A-6D are a plurality of sets of data of turn-on currents of a plurality of first thin film transistors and a plurality of second thin film transistors that serve as reset transistors in a display substrate provided by at least one embodiment of the present disclosure.
Figure 6B:
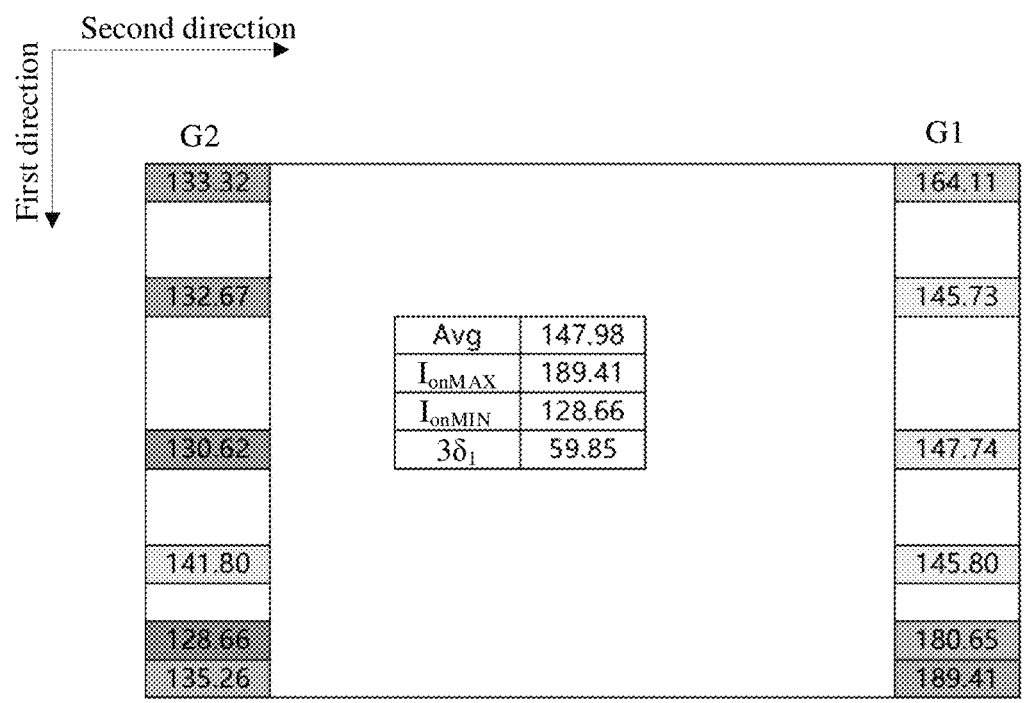
Figure 6C:
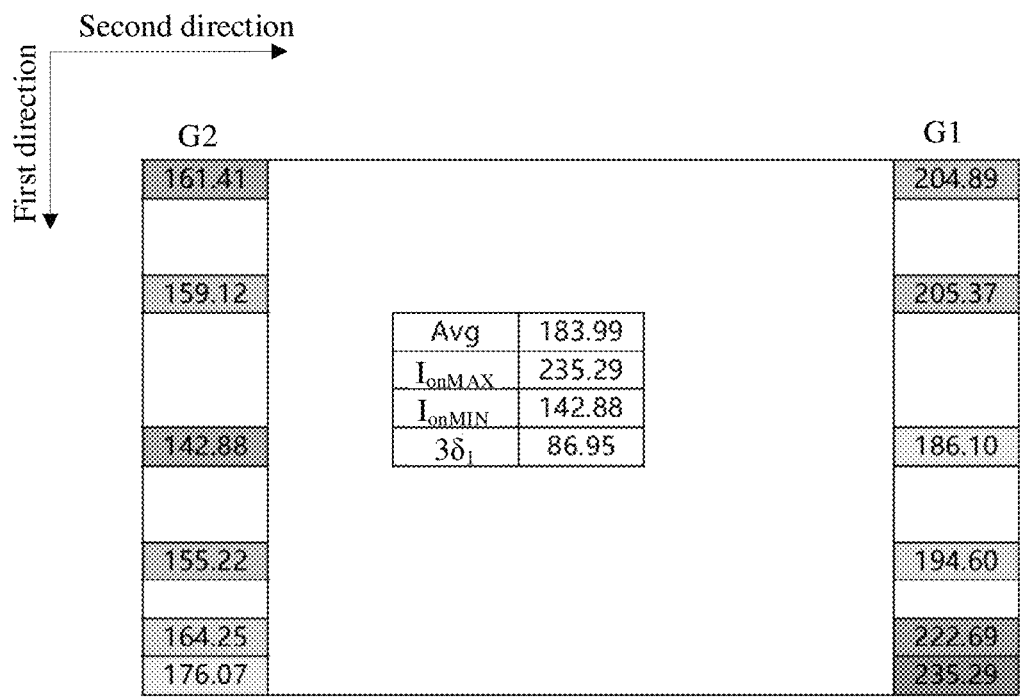
Figure 6D:
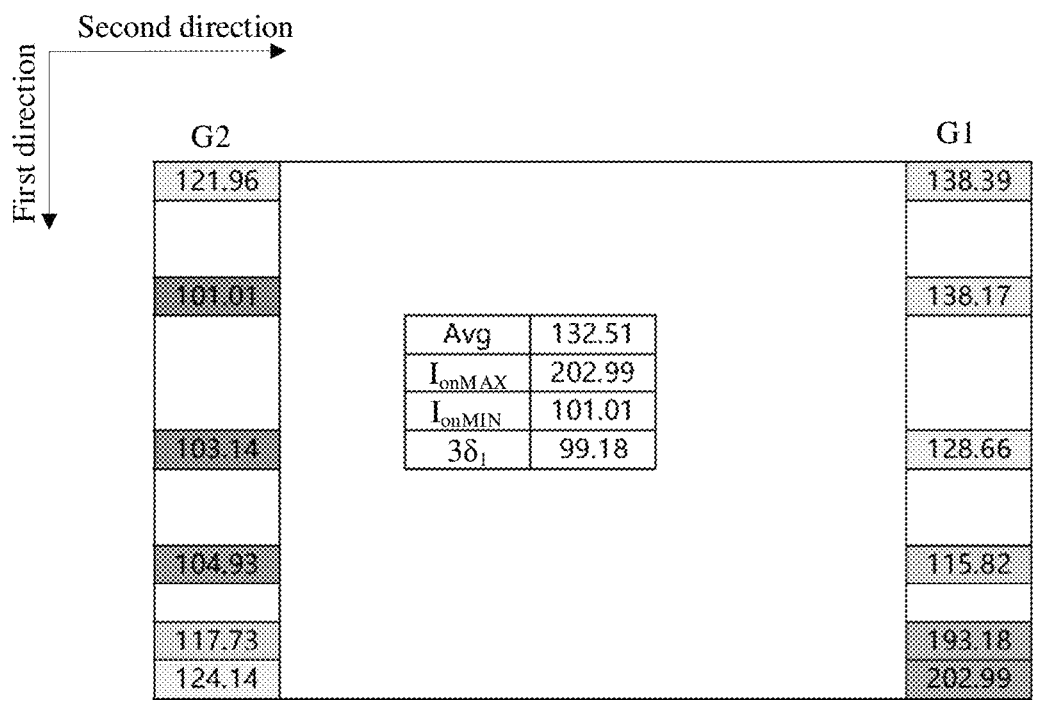
Figure 7A:
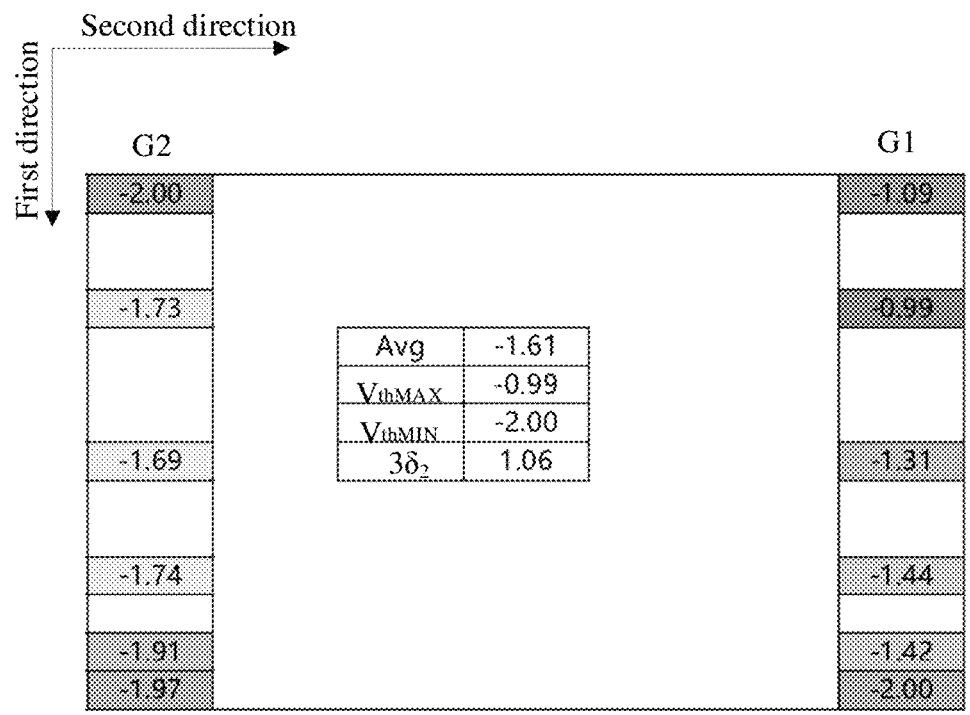
FIGS. 7A-7D are a plurality of sets of data of threshold voltages of a plurality of first thin film transistors and a plurality of second thin film transistors that serve as output transistors in a display substrate provided by at least one embodiment of the present disclosure.
Figure 7B:
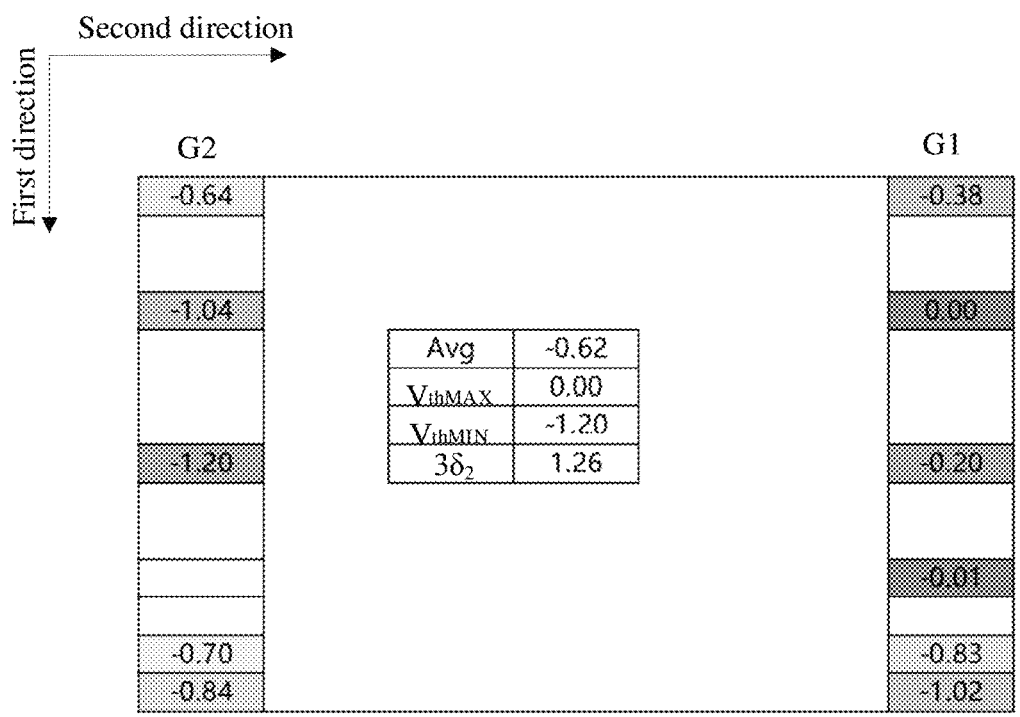
Figure 7C:
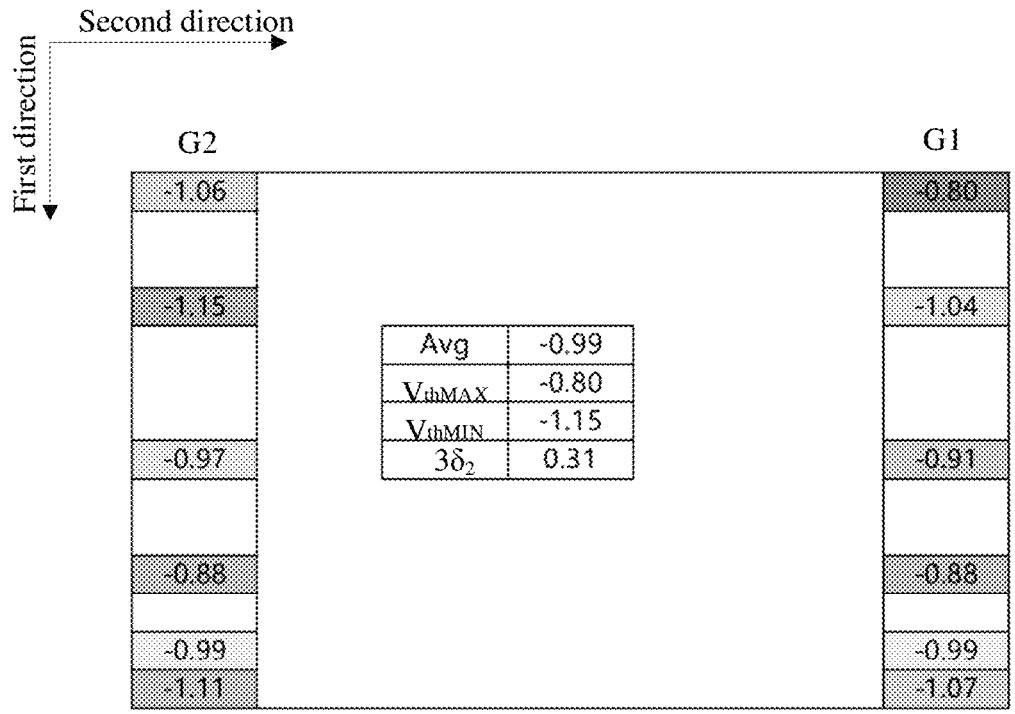
Figure 7D:
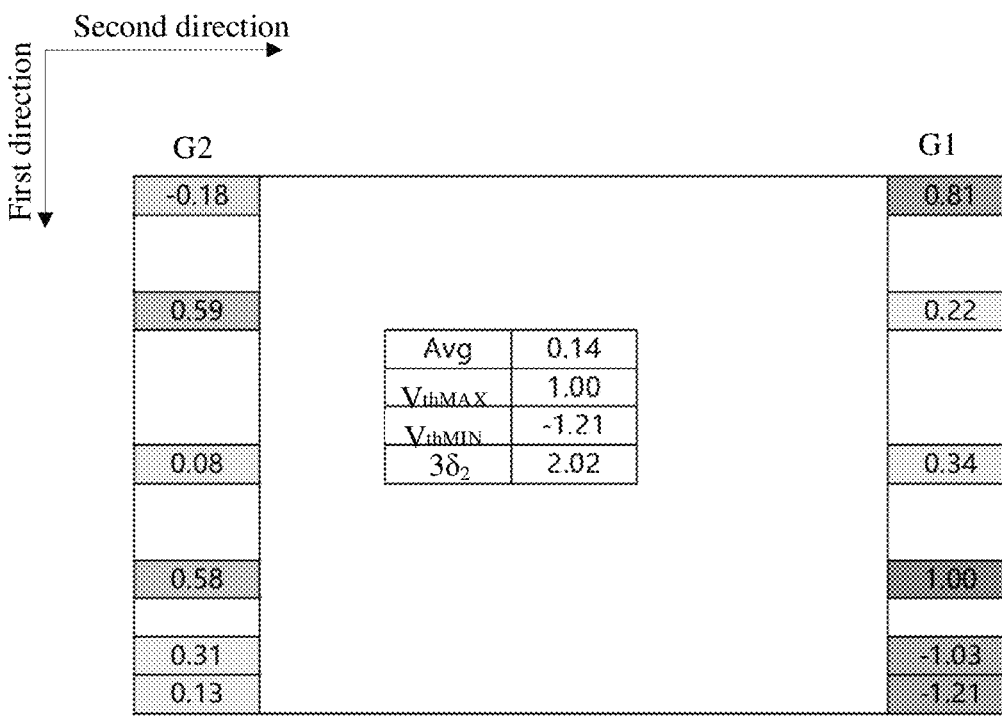
Figure 8A:
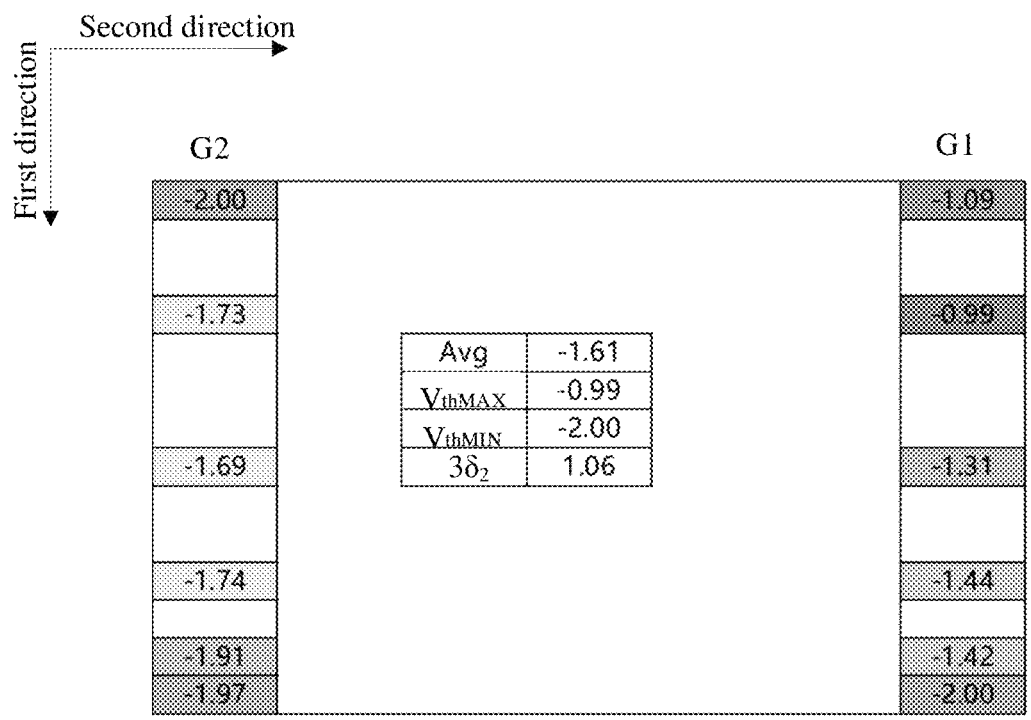
FIGS. 8A-8D are a plurality of sets of data of threshold voltages of a plurality of first thin film transistors and a plurality of second thin film transistors that serve as reset transistors in a display substrate provided by at least one embodiment of the present disclosure.
Figure 8B:
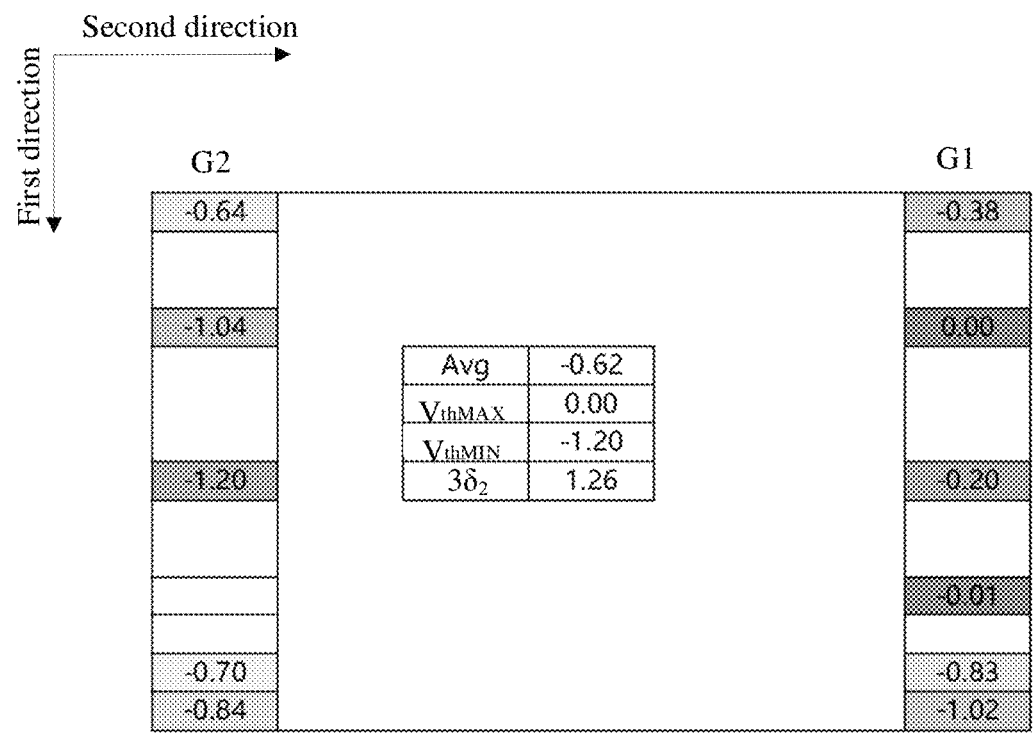
Figure 8C:
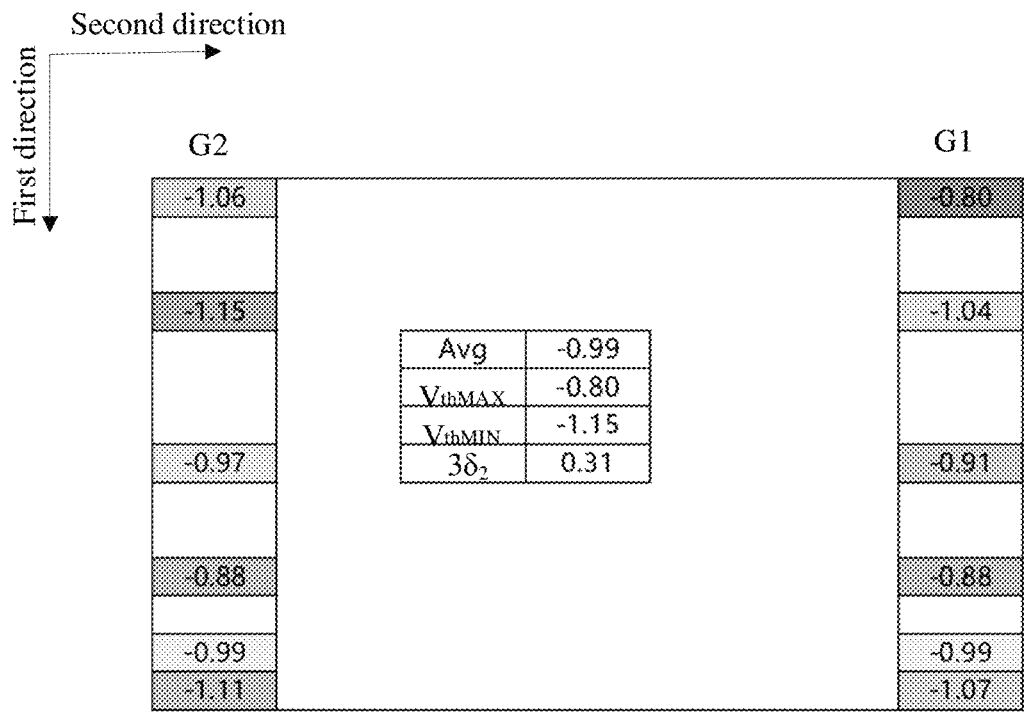
Figure 8D:
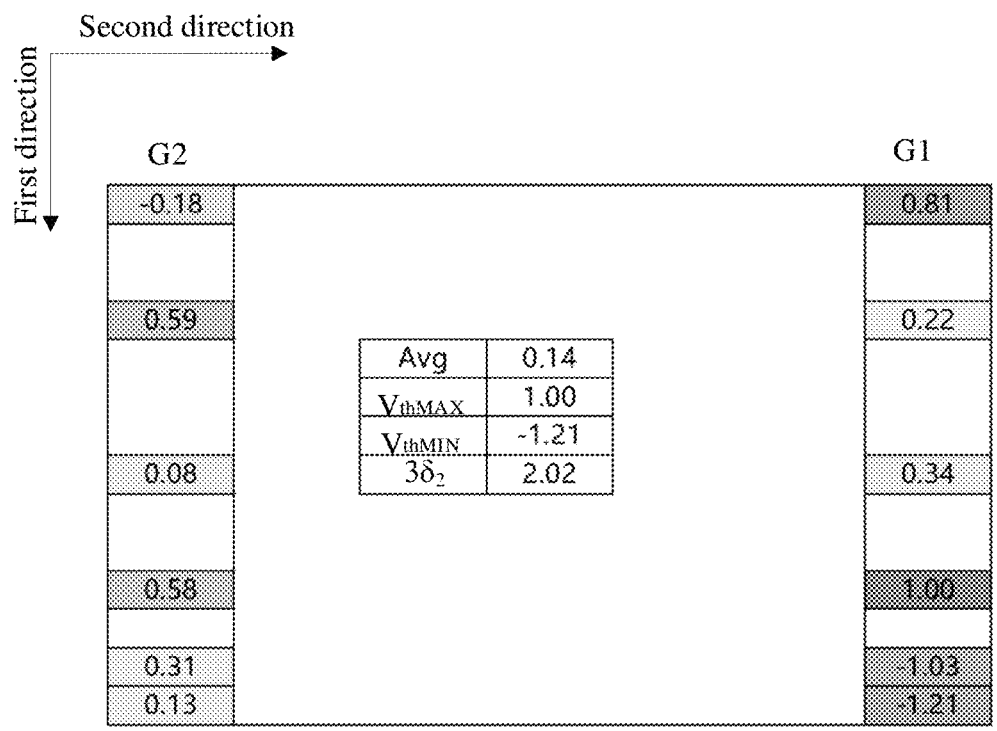

For example, FIG. 4 shows another schematic planar view of the display substrate provided by the embodiments of the present disclosure. As shown in FIG. 4, in some embodiments, the second side has a first region R1, a second region R2, and a third region R3 arranged in sequence along the first direction, and the average turn-on current of the plurality of second thin film transistors T2 located in the first region R1 is $I_{on21}$, the average turn-on current of the plurality of second thin film transistors T2 located in the second region R2 is $I_{on22}$, the average turn-on current of the plurality of second thin film transistors T2 located in the third region R3 is $I_{on23}$, $I_{on21} > I_{on22}$, and $I_{on23} > I_{on22}$. Therefore, the average turn-on current of the plurality of second thin film transistors T2 located in the middle region are smaller than the average turn-on current of the plurality of second thin film transistors T2 located at the upper side of the middle region and the average turn-on current of the plurality of second thin film transistors T2 located at the lower side of the middle region. This design can improve the display effect of the display substrate, that is, improve the viewing effect of the viewer.

For example, in some examples, the plurality of first thin film transistors T1 located on the first side may also have the above design, which is not repeated here.

For example, as shown in FIG. 2A, the first thin film transistor T1 includes a first active layer T11, a first gate electrode T12, a first source-drain electrode T13, and a second source-drain electrode T14. As shown in FIG. 2B, the second thin film transistor T2 includes a second active layer T21, a second gate electrode T22, a third source-drain electrode T23, and a fourth source-drain electrode T24. The third thin film transistor T3 includes a third active layer T31, a third gate electrode T32, a fifth source-drain electrode T33 and a sixth source-drain electrode T34. For example, the first thin film transistor T1, the second thin film transistor T2, and the third thin film transistor T3 are arranged in the same layer, that is, the corresponding layers in the first thin film transistor T1, the second thin film transistor T2, and the third thin film transistor T3 are all arranged in the same layer, thereby simplifying the manufacturing process of the display substrate.

It should be noted that one of the first source-drain electrode and the second source-drain electrode of each TFT is the source electrode and the other is the drain electrode, which are symmetrical in structure, so they may be interchanged in implementation.

For example, in some embodiments, in the case where gate voltages Vg of the plurality of first thin film transistors T1 are in a range of 10V-20V, such as 15V, the turn-on currents of the plurality of first thin film transistors T1 and the turn-on currents of the plurality of second thin film transistors T2 are both greater than 1200 μA.

For example, in some embodiments, in the case where gate voltages Vg of the plurality of first thin film transistors T1 are in a range of 10V-20V, for example, 15V, the maximum value of the turn-on currents of the plurality of first thin film transistors T1 is $I_{on1MAX}$, the minimum value of the turn-on currents of the plurality of first thin film transistors T1 is $I_{on1MIN}$, and $I_{on1MAX} - I_{on1MIN} \leq 1000$ μA; in the case where gate voltages Vg of the plurality of second thin film transistors T2 are in a range of 10V-20V, for example, 15V, the maximum value of the turn-on currents of the plurality of second thin film transistors T2 is $I_{on2MAX}$, the minimum value of the turn-on currents of the plurality of second thin film transistors T2 is $I_{on2MIN}$, and $I_{on2MAX} - I_{on2MIN} \leq 1000$ μA.

All the above designs are helpful to improve the display uniformity of the display substrate and the visual effect of the viewer.

For example, in some embodiments, the turn-on currents of the plurality of first thin film transistors T1 of the plurality of first shift register units G11 and the plurality of second thin film transistors T2 of the plurality of second shift register units G21 have the maximum value of $I_{onMAX}$ and have the minimum value of $I_{onMIN}$, it is defined that $3\delta_1 = (I_{onMAX} - I_{onMIN})/(I_{onMAX} + I_{onMIN})$, then $3\delta_1 = 50 \sim 700$.

In the embodiments of the present disclosure, $3\delta_1$ can be used to evaluate the overall uniformity of the display substrate, and in the case where $3\delta_1$=50~700, the display substrate has a good display effect, which can meet the visual needs of viewers.

For example, FIGS. 5A-5D show the data of the turn-on currents of a plurality of first thin film transistors T1 and a plurality of second thin film transistors T2 that serve as output transistors under multiple tests. Corresponding to the orientation of FIG. 1. FIGS. 5A-5D show the data of the turn-on currents of the first thin film transistors T1 and the second thin film transistors T1 at various positions. The data is measured in the case where the gate voltages Vg of the plurality of first thin film transistors T1 are 15V and the gate voltages Vg of the plurality of second thin film transistors T2 are 15V, and the unit of the data is microamperes (µA), Avg represents the average of the turn-on currents of the plurality of first thin film transistors T1 and the plurality of second thin film transistors T2. It can be seen that each display substrate has the above design, and in this case, the display substrate has a better display effect, which can meet the visual needs of viewers.

For example, in other embodiments, both the first thin film transistor T1 and the second thin film transistor T2 are reset transistors, and the gate electrode of the reset transistor is connected to a reset control signal terminal, which will be described in detail later.

For example, in this embodiment, $I_{on1}-I_{on2} < I_{on2} \times 30\%$. For example, $I_{on1}-I_{on2} < I_{on2} \times 20\%$. On the one hand, the above design can satisfy the display uniformity of the display substrate, and on the other hand, it can simplify the manufacturing process and improve the production yield.

For example, in this embodiment, the turn-on currents of the plurality of first thin film transistors T1 of the plurality of first shift register units G11 and the plurality of second thin film transistors T2 of the plurality of second shift register units G21 have the maximum value of $I_{onMAX}$, and have the minimum value of $I_{onMIN}$, it is defined that $3\delta_1 = (I_{onMAX}-I_{onMIN})/(I_{onMAX}+I_{onMIN})$, then $3\delta_1$=50~700.

For example, FIGS. 6A-6D show the data of the turn-on currents of a plurality of first thin film transistors T1 and a plurality of second thin film transistors T1 that serve as reset transistors under multiple tests. Corresponding to the orientation of FIG. 1. FIGS. 6A-6D show the data of the turn-on currents of the plurality of first thin film transistors T1 and the plurality of second thin film transistors T2 at various positions. The data is measured in the case where the gate voltages Vg of the plurality of first thin film transistors T1 are 15V and the gate voltages Vg of the plurality of second thin film transistors T2 are 15V, and the unit of the data is microamperes (µA), Avg represents the average of the turn-on currents of the plurality of first thin film transistors T1 and the plurality of second thin film transistors T2. It can be seen that each display substrate has the above design, and in this case, the display substrate has a better display effect, which can meet the visual needs of viewers.

For example, in some embodiments, the average threshold voltage of the plurality of first thin film transistors T1 of the plurality of first shift register units G11 is $V_{th1}$, and the average threshold voltage of the plurality of second thin film transistors T2 of the plurality of second shift register units G21 is $V_{th2}$, and then $V_{th1} > V_{th2}$.

It should be noted that in the embodiments of the present disclosure, the threshold voltage refers to the turn-on voltage of the thin film transistor.

For example, in some embodiments, $V_{th1}-V_{th2} < |V_{th2}| \times 30\%$. That is, the average threshold voltage of the plurality of first thin film transistors on the first side is larger than, within the range of 30%, the average threshold voltage of the plurality of second thin film transistors on the second side. For example, in some examples, $V_{th1}-V_{th2} < |V_{th2}| \times 20\%$. On the one hand, the above design can satisfy the display uniformity of the display substrate, and on the other hand, it can simplify the manufacturing process and improve the production yield.

For example, in some embodiments, a source-drain input voltage of each of the plurality of first thin film transistors is Vd, Vd=10V-20V, and the turn-on current of each of the plurality of first thin film transistors is Id, Id=$10^{-8}$ A, $|V_{th1}|<2V$, $|V_{th2}|<2V$.

For example, in some embodiments, the maximum value of the threshold voltages of the plurality of first thin film transistors T1 is $V_{th1MAX}$, the minimum value of the threshold voltages of the plurality of first thin film transistors T1 is $V_{th1MIN}$, and $V_{th1MAX}-V_{th1MIN} \leq 2V$; the maximum value of the threshold voltages of the plurality of second thin film transistors T2 is $V_{th2MAX}$, the minimum value of threshold voltages of the plurality of second thin film transistors is $V_{th2MIN}$, and $V_{th2MAX}-V_{th2MIN} \leq 2V$.

For example, in some embodiments, threshold voltages of the plurality of first thin film transistors T1 of the plurality of first shift register units G11 and the plurality of second thin film transistors T2 of the plurality of second shift register units G21 have the maximum value of $V_{thMA}$ and the minimum value of $V_{thMIN}$, it is defined that $3\delta_2 = (V_{thMAX}-V_{thMIN})/(V_{thMAX}+V_{thMIN})$, and then $3\delta_2$=0.1~2.5.

For example, FIGS. 7A-7D show the data of the threshold voltages of a plurality of first thin film transistors T1 and a plurality of second thin film transistors T2 that serve as output transistors under multiple tests. Corresponding to the orientation of FIG. 1, FIGS. 7A-7D show the data of the threshold voltages of the first thin film transistors T1 and the second thin film transistors T2 at various positions, these data are tested under the case where the source-drain electrode input voltages Vd of the plurality of first thin film transistors T1 are in a range of 10V-20V, for example, 15.1V, and the turn-on currents Id of the plurality of first thin film transistors T1 are equal to $10^{-8}$ A, and the source-drain electrode input voltages Vd of the plurality of second thin film transistors T2 are in a range of 10V-20V, for example, 15.1V, and the turn-on currents Id of the plurality of second thin film transistors T2 are equal to $10^{-8}$ A, the unit of the data is volt (V), Avg represents the average value of threshold voltages of the plurality of first thin film transistors T1 and the plurality of second thin film transistors T2. It can be seen that each display substrate has the above design, and in this case, the display substrate has a better display effect.

For example, FIGS. 8A-8D show the data of the threshold voltages of a plurality of first thin film transistors T1 and a plurality of second thin film transistors T2 as reset transistors under multiple tests. Corresponding to the orientation of FIG. 1, FIGS. 8A-8D show the data of the threshold voltages of the first thin film transistor T1 and the second thin film transistor T2 at various positions, these data are tested under the case where the source-drain electrode input voltages Vd of the plurality of first thin film transistors T1 are in a range of 10V-20V, for example, 15.1V, and the turn-on currents Id of the plurality of first thin film transistors T1 are equal to $10^{-8}$ A, and the source-drain electrode input voltages Vd of the plurality of second thin film transistors T2 are in a range of 10V-20V, for example, 15.1V, and the turn-on currents Id of the plurality of second thin film transistors T2 are equal to $10^{-8}$ A, the unit of the data is volt (V), Avg represents the average value of threshold voltages of the plurality of first thin film transistors T1 and the plurality of second thin film transistors T2. It can be seen that each display substrate has the above design, and in this case, the display substrate has a better display effect.

For example, in some embodiments, the average lifetime of the plurality of first thin film transistors T1 of the plurality of first shift register units G11 is longer than the average lifetime of the plurality of second thin film transistors T2 of the plurality of second shift register units G21.

For example, in some embodiments, viewed from the base substrate 10 to the first gate driver circuit G1, that is, in the direction of the display substrate itself, the first side is the left side of the display region AA and the second side is the right side of the display region AA. Or, viewed in the direction where the viewer faces the display substrate, that is, when the display substrate displays images, the viewer faces the display substrate, in this case, the first side is the right side of the display region AA, and the second side is the left side of the display region AA, as shown in FIG. 1.

For example, in some embodiments, as shown in FIG. 1, the size of the display substrate in the second direction is larger than the size of the display substrate in the first direction. That is, when the viewer views the display substrate, the size of the display substrate in the horizontal direction is larger than the size of the display substrate in the vertical direction.

Figure 9:
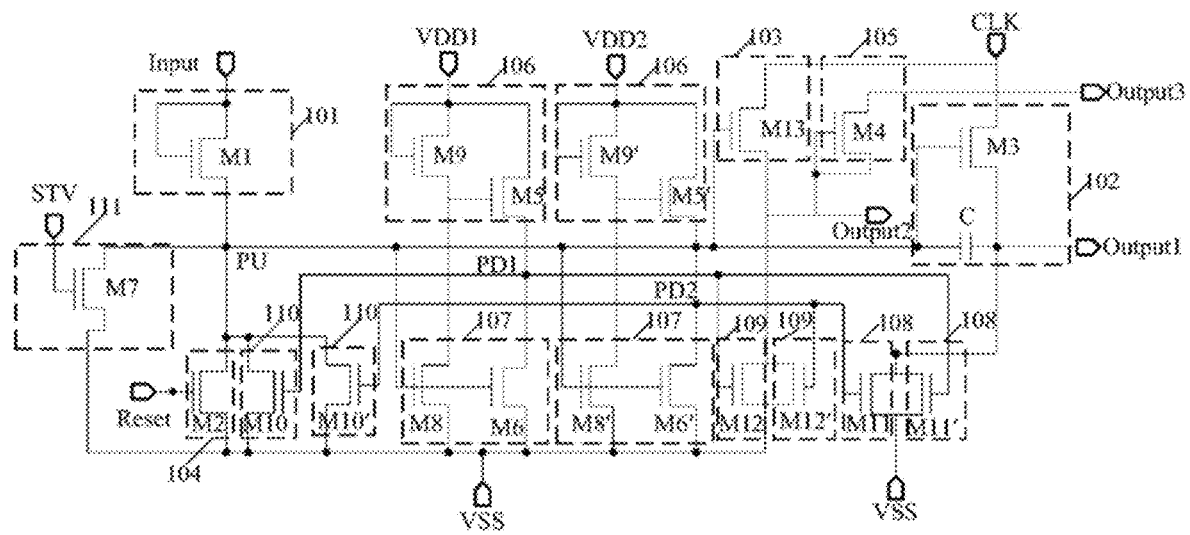
FIG. 9 is a circuit diagram of a GOA architecture in a display substrate provided by at least one embodiment of the present disclosure.

For example, FIG. 9 shows an exemplary circuit diagram of one first shift register unit in the display substrate provided by the embodiments of the present disclosure, and the second shift register unit has the same circuit structure as the first shift register unit, for example. In this case, the thin film transistors with the same functions in the first shift register unit and the second shift register unit are basically located at the same positions in the circuits respectively, and have the same circuit connection relationship, so as to realize the same functions.

For example, as shown in FIG. 9, in some examples, the first shift register unit G11 includes an input sub-circuit 101, a first output sub-circuit 102, a second output sub-circuit 103, a reset sub-circuit 104 and a monitor sub-circuit 105. The input sub-circuit 101 is configured to response to the input signal, and pre-charge the pull-up node PU by the input signal; the pull-up node PU is the connection node between the input sub-circuit 101, the first output sub-circuit 102, the second output sub-circuit 103 and the reset sub-circuit 104; the first output sub-circuit 102 is configured to respond to the potential of the pull-up node PU, and output the clock signal through the first output terminal Output1; the second output sub-circuit 103 is configured to respond to the potential of the pull-up node PU, and outputs a synchronization signal output by the first output terminal Output1 through the second output terminal Output2; the reset sub-circuit 104 is configured to respond to the reset signal, and reset the potential of the pull-up node PU through the second power supply voltage; the monitor sub-circuit 104 is configured to monitor the second output terminal Output2 and output the monitoring result through the third output terminal Output3.

Therefore, in the shift register unit described above, the first output sub-circuit 102 can output a GOA signal, such as the clock signal, through the first output terminal Output1, the second output sub-circuit 103 can output the synchronization signal output by the first output terminal Output1 through the second output terminal Output2, and the monitor sub-circuit 104 can monitor the second output terminal Output2, and output the monitoring result through the third output terminal Output3 at the same time, so that the GOA signal output by the second output terminal Output2 can be monitored, and whether the GOA signal output by the shift register is abnormal or not can be judged, and therefore the real-time monitoring of the GOA signal can be realized, and the working state change of the GOA can be monitored in the process of product reliability, and then the abnormal point of the GOA signal can be detected at the first time.

For example, in some examples, as shown in FIG. 9, the first shift register may further include at least one pull-down control sub-circuit 106, at least one pull-down sub-circuit 107, at least one first noise reduction sub-circuit 108, at least one second noise reduction sub-circuit 109 and at least one third noise reduction sub-circuit 110. The pull-down sub-circuit 106 is configured to respond to the first power supply voltage, and control the potential of the pull-down node PD through the first power supply voltage; the pull-down node PD is a connection node between the pull-down control sub-circuit 106 and the pull-down sub-circuit 107; the pull-down circuit 107 is configured to respond to the potential of the pull-up node PU, and pull down the potential of the pull-down node PD through the second power supply voltage; the first noise reduction sub-circuit 108 is configured to respond to the potential of the pull-down node PD, and reduce the noise of the first output terminal Output1 through the second power supply voltage; the second noise reduction sub-circuit 109 is configured to respond to the potential of the pull-down node PD, and reduce the noise of the second output terminal Output2 through the second power supply voltage; the third noise reduction sub-circuit 110 is configured to respond to the potential of the pull-down node PD, and reduce the noise of the pull-up node PU through the second power supply voltage.

For example, in some embodiments, as shown in FIG. 9, the first shift register unit may further include an initialization sub-circuit 111; the initialization sub-circuit 111 is configured to respond to the initialization signal, and initialize the potential of the pull-up node PU through the second power supply voltage.

Specifically, as shown in FIG. 9, the input sub-circuit 101 includes a first transistor M1 (input transistor), the gate electrode and source electrode of the first transistor M1 are both connected to the input signal terminal Input, and the drain electrode of the first transistor M1 is connected to the pull-up node PU. The Reset sub-circuit 104 includes a second transistor M2 (i.e., the above-mentioned reset transistor). The gate electrode of the second transistor M2 is connected to the reset control signal terminal Reset, the source electrode of the second transistor M2 is connected to the second power supply voltage terminal VSS, and the drain electrode of the second transistor M2 is connected to the pull-up node PU. The first output sub-circuit 102 includes a third transistor M3 (i.e., the above output transistor) and a storage capacitor C. The gate electrode of the third transistor M3 is connected to the pull-up node PU, the source electrode of the third transistor M3 is connected to the clock signal terminal CLK, and the drain electrode of the third transistor M3 is connected to the first output terminal Output1; one end of the storage capacitor C is connected to the pull-up node PU, and the other end is connected to the first output terminal Output1. The second output sub-circuit 103 includes a thirteenth transistor M13 (the thirteenth transistor M13 is also an output transistor); the gate electrode of the thirteenth transistor M13 is connected to the pull-up node PU, the source electrode of the thirteenth transistor M13 is connected to the clock signal terminal CLK, and the drain electrode of the thirteenth transistor M13 is connected to the second output terminal Output2.

To distinguish M3 from M13, M3 is the first output transistor and M13 is the second output transistor in the embodiments of the present disclosure.

In the input stage, the signal input terminal Input writes a high-level signal, the first transistor M1 is turned on, and the high-level signal can pre-charge the pull-up node PU through the first transistor M1. In the output stage, the potential of the pull-up node PU is pre-charged and pulled up, and stored in the storage capacitor C. In this stage, the first transistor M1 is turned off, the storage capacitor C discharges to further raise the potential of the pull-up node PU, and thus the third transistor M3 and the thirteenth transistor M13 are both turned on. The first output terminal Output1 outputs the high-level signal written by the clock signal terminal CLK, while the second output terminal Output2 outputs the synchronization signal output by the first output terminal Output1. In the Reset stage, the reset control signal terminal RESET is written with a high-level signal, the second transistor M2 is turned on, and the potential of the pull-up node PU is reset by the low power supply voltage written by the second power supply voltage terminal VSS.

For example, the monitor sub-circuit 105 includes a fourth transistor M4, the gate electrode and source electrode of the fourth transistor M4 are both connected to the second output terminal Output2, and the drain electrode of the fourth transistor M4 is connected to the third output terminal Output3.

It should be noted that the gate electrode and source electrode of the fourth transistor M4 are connected to the second output terminal Output2, and the drain electrode of the fourth transistor M4 is connected to the third output terminal Output3, in the case where the GOA signal output by the second output terminal Output2 is a high-level signal, the fourth transistor M4 can be turned on under the control of the high-level signal, and the high-level signal is output through the third output terminal Output3. By comparing the high-level signal output by the third output terminal Output3 with the reference high-level signal, if the signal output by the third output terminal Output3 is the same as the reference high-level signal, it means that the GOA signal output by the second output terminal Output2 is normal; if the signal output by the third output terminal Output3 is different from the reference high-level signal or no output signal is output from the third output terminal Output3, it means that the GOA signal output by the second output terminal Output2 is abnormal, so that the real-time monitoring of the GOA signal can be realized, and the working state change of the GOA can be monitored in the process of product reliability, and then the abnormal point of the GOA signal can be detected at the first time, thus avoiding AD and other defects.

For example, the pull-down control sub-circuit 106 includes a ninth transistor M9 and a fifth transistor M5. The gate electrode and source electrode of the ninth transistor M9 are both connected to the first power supply voltage terminal VDD, and the drain electrode of the ninth transistor M9 is connected to the gate electrode of the fifth transistor M5. The gate electrode of the fifth transistor M5 is connected to the drain electrode of the ninth transistor M9, the source electrode of the fifth transistor M5 is connected to the first power supply voltage terminal VDD, and the drain electrode of the fifth transistor M5 is connected to the pull-down node PD. The pull-down circuit 107 includes a sixth transistor M6 and an eighth transistor M8. The gate electrode of the sixth transistor M6 is connected to the pull-up node PU, the source electrode of the sixth transistor M6 is connected to the pull-down node PD, and the drain electrode of the sixth transistor M6 is connected to the second power supply voltage terminal VSS. The gate electrode of the eighth transistor M8 is connected to the pull-up node PU, the source electrode of the eighth transistor M8 is connected to the drain electrode of the ninth transistor M9, and the drain electrode of the eighth transistor M8 is connected to the second power supply voltage terminal VSS. The first noise reduction sub-circuit 108 includes an eleventh transistor M11, the gate electrode of the eleventh transistor M11 is connected to the pull-down node PD, the source electrode of the eleventh transistor M11 is connected to the first output terminal Output1, and the drain electrode of the eleventh transistor M11 is connected to the second supply voltage terminal VSS. The second noise reduction sub-circuit 109 includes a twelfth transistor M12, the gate electrode of the twelfth transistor M12 is connected to the pull-down node PD, the source electrode of the twelfth transistor M12 is connected to the second output terminal Output2, and the drain electrode of the twelfth transistor M12 is connected to the second power supply voltage terminal VSS. The third noise reduction sub-circuit 110 includes a tenth transistor M10, the gate electrode of the tenth transistor M10 is connected to the pull-down node PD, the source electrode of the tenth transistor M10 is connected to the pull-up node PU; and the drain electrode of the tenth transistor M10 is connected to the second power supply voltage terminal VSS.

It should be noted that in the example shown in FIG. 9, two pull-down control sub-circuits 106, two pull-down sub-circuits 107, two first noise reduction sub-circuits 108, two second noise reduction sub-circuits 109 and two third noise reduction sub-circuits 110 are taken as examples for illustration. It can be understood that the number of each sub-circuit mentioned above may be one or other, and the implementation principle in this case is the same as the above, and is not repeated here.

For example, in FIG. 9, the fifth transistors in the first one and the second one of the pull-down control sub-circuits 106 are respectively denoted by M5 and M5', and the ninth transistors in the first one and the second one of the pull-down control sub-circuits 106 are respectively denoted by M9 and M9'; the sixth transistors in the first one and the second one of the pull-down circuits 107 are respectively denoted by M6 and M6', the eighth transistor M8 in the first one and the second one of the pull-down circuits 107 are respectively denoted by M8 and M8'; the eleventh transistors in the first one and the second one of the first noise reduction circuits 108 are respectively denoted by M11 and M11'; the twelfth transistors M12 in the first one and the second one of the second noise reduction circuits 109 are respectively denoted by M12 and M12'; the tenth transistors in the first one and the second one of the third noise reduction circuits 110 are respectively denoted by M10 and M10'; the first power supply voltage terminals connected to the first one and the second one of the pull-down control sub-circuits 106 are respectively denoted by VDD1 and VDD2. In addition, the first one of the pull-down control sub-circuits 106 and the first one of the pull-down circuits 107 are connected, and the connection node between the first one of the pull-down control sub-circuits 106 and the first one of the pull-down circuits 107 is represented by the pull-down node PD1; the second one of the pull-down control sub-circuits 106 is connected to the second one of the pull-down circuits 107, and the connection node between the second one of the pull-down control sub-circuits 106 and the second one of the pull-down circuits 107 is represented by the pull-down node PD2; the first one of the first noise reduction circuits 108 is connected to PD1, and the second one of the first noise reduction circuits 108 is connected to PD2; the first one of the second noise reduction circuits 109 is connected to PD1, and the second one of the second noise reduction circuits 109 is connected to PD2; the first one of the third noise reduction circuits 110 is connected to PD1, and the second one of the third noise reduction circuits 110 is connected to PD2.

For example, during the scanning process of a frame of image, the first one of the pull-down control sub-circuits 106, the first one of the pull-down circuits 107, the first one of the first noise reduction circuits 108, the first one of the second noise reduction circuits 109, and the first one of the third noise reduction circuits 110 work, or the second one of the pull-down control sub-circuits 106, the second one of the first pull-down circuits 107, the second one of the first noise reduction circuits 108, and the second one of the second noise reduction circuits 108 work. That is, the number of each of the pull-down control sub-circuit 106, the first pull-down circuit 107, the first noise reduction circuit 108, the second noise reduction circuit 109, and the third noise reduction circuit 110 may be multiple, and only one of the sub-circuits with the same function works when scanning a frame of image, and at the same time, it can be switched to the other one to work at preset working time, so that the lifetime of the shift register can be prolonged. In the noise reduction stage, because the pull-up node PU is pulled down to a low level potential in the reset stage, and the fifth transistor M5 and the ninth transistor M9 are always controlled by the first power supply voltage written by the first power supply voltage terminal VDD1, in this case, the potential of the pull-down node PD1 is a high-level signal, the eleventh transistor M11 is turned on, and the second power supply voltage written by the second power supply voltage terminal VSS reduces the noise of the output signal of the first output terminal Output1 through the eleventh transistor M11. At the same time, the twelfth transistor M12 and the tenth transistor M10 are also turned on, and the second power supply voltage written by the second power supply voltage terminal VSS reduces the noise of the output signal of the second output terminal Output2 and the noise of the output signal of the pull-up node PU through the twelfth transistor M12 and the tenth transistor M10, respectively.

For example, the initialization sub-circuit 111 includes a seventh transistor M7, the gate electrode of the seventh transistor M7 is connected to the initialization signal terminal STV, the source electrode of the seventh transistor M7 is connected to the pull-up node PU, and the drain electrode of the seventh transistor M7 is connected to the second power supply voltage terminal VSS.

It should be noted that when the next frame of display image is displayed, the initialization signal terminal STV writes a high-level signal, and the seventh transistor M7 is turned on, and the potential of the pull-up node PU is initialized by the low power supply voltage written by the second power supply voltage terminal VSS, so as to prevent the adjacent frames of display image from interfering with each other and affecting the display effect.

It can be understood that the first shift register unit and the second shift register unit provided by the embodiments of the present disclosure may be other circuit structures, such as 17T1C structure, 18T2C structure, 21T1C structure, etc., besides the above-mentioned 19T1C structure. The embodiments of the present disclosure do not limit the specific structures of the first shift register unit and the second shift register unit. For example, in the case where the structures of the first shift register unit and the second shift register unit are the 17T1C structures, compared with the above-mentioned 19T1C structure, the 17T1C structure may not include the ninth transistors M9 and M9', but the implementation principle of the 17T1C structure is the same as that of the above-mentioned 19T1C structure shift register unit, and is not repeated here.

Figure 11:
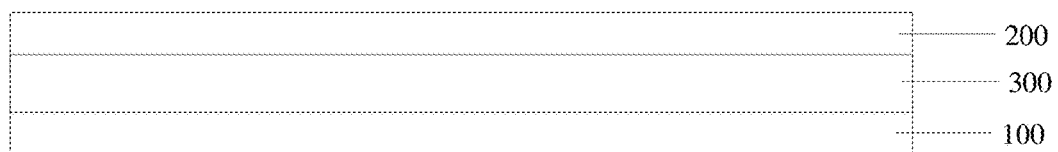
FIG. 11 is a schematic cross-sectional view of a display panel provided by at least one embodiment of the present disclosure.

At least one embodiment of the present disclosure provides a display panel, and FIG. 11 shows a schematic cross-sectional view of the display panel. As shown in FIG. 11, the display panel includes a display substrate 100 and an opposite substrate 200 which are arranged opposite to each other, and a liquid crystal layer 300 sandwiched between the display substrate 100 and the opposite substrate 200, so that the display panel can be realized as a liquid crystal display panel.

For example, the display substrate 100 is the display substrate provided by the embodiments of the present disclosure. In this case, as shown in FIGS. 2A and 2B, the first planarization layer 20 is disposed on the pixel driving circuits of the plurality of sub-pixels P of the display substrate, and the pixel driving circuit further includes a first driving electrode E1 and a second driving electrode E2 disposed on the side of the first planarization layer 150 away from the base substrate 10. The liquid crystal layer 300 includes a liquid crystal material, and the liquid crystal material can be driven by the first driving electrode E1 and the second driving electrode E2 to be in different deflections, so as to achieve different light transmittance to realize display. For example, the first driving electrode E1 is electrically connected to the pixel driving circuit through the fifth source-drain T33 of the third thin film transistor T3, and the second driving electrode E2 may be electrically connected to a power supply line (not shown).

For example, in some embodiments, as shown in FIGS. 2A and 2B, the second driving electrode E2 may be in the same layer as the first driving electrode E1 and spaced apart from the first driving electrode E1; or, in other examples, the second driving electrode E2 and the first driving electrode E1 may be in different layers and spaced apart from each other, as long as the first driving electrode E1 and the second driving electrode E2 can drive the liquid crystal material to deflect to achieve different light transmittance. The embodiments of the present disclosure do not limit the specific arrangement of the first driving electrode E1 and the second driving electrode E2.

For example, as shown in FIGS. 2A and 2B, a second planarization layer 20 is further provided on the side of the first driving electrode E1 away from the base substrate 10. The first planarization layer 20 and the second planarization layer 30 may be made of an organic insulation material such as polyimide or acrylic resin. For example, the first driving electrode E1 and the second driving electrode E2 may be made of aluminum, molybdenum, titanium, copper or other metal materials or an alloy material thereof.

For example, in the embodiments of the present disclosure, the base substrate 10 may be a rigid substrate such as a glass substrate, or a quartz substrate, or a flexible substrate such as polyimide, and each gate electrode may be made of a metal material or an alloy material such as copper (Cu), aluminum (Al), titanium (Ti) and molybdenum (Mo), for example, in a single-layer metal structure or a multi-layer metal structure, such as titanium/aluminum/titanium multi-layer metal structure. Each source electrode and drain electrode may be made of a metal material or an alloy material such as copper (Cu), aluminum (Al), titanium (Ti), molybdenum (Mo), for example, in a single-layer metal structure or a multi-layer metal structure such as titanium/aluminum/titanium multi-layer metal structure. The embodiments of the present disclosure do not specifically limit the material of each structure.

In the embodiments of the present disclosure, each thin film transistor may be a P-type thin film transistor or an N-type thin film transistor, and the structure may be a bottom gate type, a top gate type or a double gate type. The embodiments of the present disclosure do not limit the specific form of each thin film transistor.

For example, the display panel provided by the embodiments of the present disclosure may be other types of display panels such as an organic light emitting diode display panel or a quantum dot display panel, and the embodiments of the present disclosure do not limit the type of the display panel.

The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged or narrowed, that is, the drawings are not drawn in a real scale. However, it should be understood that, in the case in which a component such as a layer, film, region, substrate or the like is referred to be "on" or "under" another component, the component may be directly on or under the another component or there may be an intermediate component.

(3) In case of no conflict, the embodiments of the present disclosure and the features in the embodiments can be combined with each other to obtain new embodiments.

What have been described above are only specific implementations of the present disclosure, the protection scope of the present disclosure is not limited thereto, and the protection scope of the present disclosure should be based on the protection scope of the claims.

What is claimed is:

1. A display substrate, comprising:
a base substrate, and a first gate driver circuit and a second gate driver circuit that are on the base substrate, wherein
the display substrate comprises a display region, and the first gate driver circuit and the second gate driver circuit are respectively on a first side of the display region and a second side of the display region that are opposite to each other;
the first gate driver circuit comprises a plurality of first shift register units arranged in a first direction, each of the plurality of first shift register units comprises a first thin film transistor having a first function in the first gate driver circuit, the first thin film transistor comprises a first active layer, and the first active layer comprises a metal oxide semiconductor material;
the second gate driver circuit comprises a plurality of second shift register units arranged in the first direction, each of the plurality of second shift register units comprises a second thin film transistor having a same function as the first thin film transistor, and the second thin film transistor comprises a second active layer, and the second active layer comprises a metal oxide semiconductor material;
an average turn-on current of the first thin film transistor of at least one first shift register unit of the plurality of first shift register units is $I_{on1}$, and an average turn-on current of the second thin film transistor of at least one second shift register unit of the plurality of second shift register units is $I_{on2}$, and $I_{on1} > I_{on2}$.

2. The display substrate according to claim 1, wherein the first thin film transistor and the second thin film transistor are output transistors playing a function of outputting signals, or input transistors playing a function of inputting signals, or reset transistors.

3. The display substrate according to claim 2, wherein the display region comprises a plurality of sub-pixels and scanning lines connected with the plurality of sub-pixels, and the first thin film transistor and the second thin film transistor are the output transistors playing the function of outputting signals, and are configured to provide gate scanning signals to the scanning lines connected with the plurality of sub-pixels;
the scanning lines extend along a second direction, and the second direction is substantially perpendicular to the first direction; the first side and the second side are opposite to each other in the second direction.

4. The display substrate according to claim 3, wherein $I_{on1} - I_{on2} < I_{on2} \times 20\%$.

5. The display substrate according to claim 3, wherein the second side has a first region, a second region and a third region that are sequentially arranged along the first direction,
an average turn-on current of a plurality of second thin film transistors in the first region is $I_{on21}$, an average turn-on current of a plurality of second thin film transistors in the second region is $I_{on22}$, and an average turn-on current of a plurality of the second thin film transistors in the third region is $I_{on23}$, $I_{on21} > I_{on22}$, and $I_{on23} > I_{on22}$.

6. The display substrate according to claim 3, wherein in a case where gate voltages Vg of a plurality of first thin film transistors are in a range of 10V-20V, turn-on currents of the plurality of first thin film transistors and a plurality of second thin film transistors are all greater than 1200 μA.

7. The display substrate according to claim 3, wherein in a case where gate voltages Vg of a plurality of first thin film transistors are in a range of 10V-20V, a maximum value of turn-on currents of the plurality of first thin film transistors is $I_{on1MAX}$, a minimum value of the turn-on currents of the plurality of first thin film transistors is $I_{on1MIN}$, and $I_{on1MAX} - I_{on1MIN} \leq 1000$ μA;
in a case where gate voltages Vg of a plurality of second thin film transistors are in a range of 10V-20V, a maximum value of turn-on currents of the plurality of second thin film transistors is $I_{on2MAX}$, and a minimum value of the turn-on currents of the plurality of second thin film transistors is $I_{on2MIN}$, and $I_{on2MAX} - I_{on2MIN} \leq 1000$ μA.

8. The display substrate according to claim 3, wherein turn-on currents of a plurality of first thin film transistors of the plurality of first shift register units and a plurality of second thin film transistors of the plurality of second shift register units have a maximum value of $I_{onMAX}$ and a minimum value of $I_{onMIN}$,
it is defined that $3\delta_1 = (I_{onMAX} - I_{onMIN})/(I_{onMAX} + I_{onMIN})$, then $$3\delta_1 = 50 \sim 700.$$

9. The display substrate according to claim 2, wherein both the first thin film transistor and the second thin film transistor are reset transistors, and gate electrodes of the reset transistors are respectively connected to a reset control signal terminal.

10. The display substrate according to claim 9, wherein $I_{on1}-I_{on2}<I_{on2}\times 30\%$.

11. The display substrate according to claim 9, wherein turn-on currents of a plurality of first thin film transistors of the plurality of first shift register units and a plurality of second thin film transistors of the plurality of second shift register units have a maximum value of $I_{onMAX}$, and a minimum value of $I_{onMIN}$, it is defined that $3\delta_1=(I_{onMAX}-I_{onMIN})/(I_{onMAX}+I_{onMIN})$, then $$3\delta_1 = 50 \sim 700.$$

12. The display substrate according to claim 1, wherein an average threshold voltage of a plurality of first thin film transistors of the plurality of first shift register units is $V_{th1}$, and an average threshold voltage of a plurality of second thin film transistors of the plurality of second shift register units is $V_{th2}$, then $$V_{th1} > V_{th2}.$$

13. The display substrate according to claim 12, wherein $V_{th1}-V_{th2}<|V_{th2}|\times 30\%$.

14. The display substrate according to claim 12, wherein in a case where a source-drain input voltage of each of the plurality of first thin film transistors is Vd, Vd=10V-20V and a turn-on current of each of the plurality of first thin film transistors is Id, Id=$10^{-8}$ A, $$|V_{th1}|<2V, |V_{th2}|<2V.$$

15. The display substrate according to claim 14, wherein a maximum value of threshold voltages of the plurality of first thin film transistors is $V_{th1MAX}$, a minimum value of the threshold voltages of the plurality of first thin film transistors is $V_{th1MIN}$, and $V_{th1MAX}-V_{th1MIN}\leq 2V$;

a maximum value of threshold voltages of the plurality of second thin film transistors is $V_{th2MAX}$, a minimum value of the threshold voltages of the plurality of second thin film transistors is $V_{th2MIN}$, and $V_{th2MAX}-V_{th2MIN}\leq 2V$.

16. The display substrate according to claim 12, wherein threshold voltages of the plurality of first thin film transistors of the plurality of first shift register units and the plurality of second thin film transistors of the plurality of second shift register units have a maximum value of $V_{thMAX}$ and a minimum value of $V_{thMIN}$, it is defined that $3\delta_2=(V_{thMAX}-V_{thMIN})/(V_{thMAX}+V_{thMIN})$, then $$3\delta_2 = 0.1 \sim 2.5.$$

17. The display substrate according to claim 1, wherein an average lifetime of a plurality of first thin film transistors of the plurality of first shift register units is longer than an average lifetime of a plurality of second thin film transistors of the plurality of second shift register units.

18. The display substrate according to claim 1, wherein the first active layer and the second active layer are in a same layer;

each of the plurality of sub-pixels comprises a pixel driving circuit, and the pixel driving circuit comprises a third thin film transistor, wherein the third thin film transistor comprises a third active layer, the third active layer is in a same layer as the first active layer and the second active layer, and comprises a plurality of metal oxide semiconductor layers that are stacked, and a material of a metal oxide semiconductor layer close to a gate electrode of the third thin film transistor is amorphous IGZO, in the amorphous IGZO, In:Ga:Zn is 1:1:1 or 4:2:3; a material of a metal oxide semiconductor layer away from the gate electrode of the third thin film transistor is crystalline IGZO, and in the crystalline IGZO, In:Ga:Zn is 4:2:3 or 1:3:6.

19. The display substrate according to claim 3, wherein a size of the display substrate along the second direction is larger than a size of the display substrate along the first direction.

20. A display panel, comprising a display substrate and an opposite substrate that are opposite to each other, and a liquid crystal layer between the display substrate and the opposite substrate, wherein the display substrate is the display substrate according to claim 1.

* * * * *